United States Patent
He et al.

(10) Patent No.: US 9,580,556 B2
(45) Date of Patent: *Feb. 28, 2017

(54) DPP WITH BRANCHED ALKYL-CHAIN OR (AND) FUSED THIOPHENE WITH BRANCHED ALKYL-CHAIN AND THE RELATED DESIGNING STRATEGY TO INCREASE THE MOLECULAR WEIGHT OF THEIR SEMI-CONDUCTING COPOLYMERS

(71) Applicant: CORNING INCORPORATED, Corning, NY (US)

(72) Inventors: Mingqian He, Horseheads, NY (US); James Robert Matthews, Painted Post, NY (US); Weijun Niu, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/968,168

(22) Filed: Dec. 14, 2015

(65) Prior Publication Data

US 2016/0222167 A1   Aug. 4, 2016

Related U.S. Application Data

(60) Provisional application No. 62/109,176, filed on Jan. 29, 2015, provisional application No. 62/242,681, filed on Oct. 16, 2015.

(51) Int. Cl.
*C08G 75/00* (2006.01)
*C08G 61/12* (2006.01)
(Continued)

(52) U.S. Cl.
CPC .......... *C08G 75/00* (2013.01); *C08G 61/123* (2013.01); *C08G 61/124* (2013.01);
(Continued)

(58) Field of Classification Search
CPC .. C08G 75/00; H01L 51/0036; H01L 51/0558
See application file for complete search history.

(56) References Cited

U.S. PATENT DOCUMENTS 7,705,108 B2   4/2010   He
7,838,623 B2   11/2010  He
(Continued)

FOREIGN PATENT DOCUMENTS

WO       2006031893           3/2006
WO    WO 2006031893 A2 *     3/2006    ........... C07D 495/04
(Continued)

OTHER PUBLICATIONS

Matthews, J. R., et al., "Scalable Synthesis of Fused Thiophene-Diketopyrrolopyrrole Semiconducting Polymers Processed from Nonchlorinated Solvents into High Performance Thin Film Transistors," Chem. Mater. 2013, 25, 782-789.*
(Continued)

*Primary Examiner* — Liam J Heincer
*Assistant Examiner* — Nicholas Hill
(74) *Attorney, Agent, or Firm* — Jason A. Barron

(57) ABSTRACT

Described herein are compositions including hereocyclic fused thiophene based compounds, polymers based on fused thiophene compounds, and methods for making the monomer and polymer along with uses in thin film-based and other devices.

5 Claims, 6 Drawing Sheets

(51) Int. Cl.
H01L 51/00 (2006.01)
H01L 51/05 (2006.01)
(52) U.S. Cl.
CPC ......... C08G 61/125 (2013.01); C08G 61/126 (2013.01); H01L 51/0036 (2013.01); C08G 2261/124 (2013.01); C08G 2261/1412 (2013.01); C08G 2261/21 (2013.01); C08G 2261/3223 (2013.01); C08G 2261/3243 (2013.01); C08G 2261/334 (2013.01); C08G 2261/344 (2013.01); C08G 2261/364 (2013.01); C08G 2261/414 (2013.01); C08G 2261/92 (2013.01); H01L 51/0558 (2013.01)

(56) References Cited

U.S. PATENT DOCUMENTS

| | | |
|---|---|---|
| 7,893,191 B2 | 2/2011 | He |
| 7,919,634 B2 | 4/2011 | He et al. |
| 7,932,344 B2 | 4/2011 | Li |
| 8,217,183 B2 | 7/2012 | He et al. |
| 8,278,346 B2 | 10/2012 | He et al. |
| 8,278,410 B2 | 10/2012 | He et al. |
| 8,349,998 B2 | 1/2013 | He |
| 8,389,669 B2 | 3/2013 | He |
| 8,642,719 B2* | 2/2014 | He .................. C08G 61/126 524/547 |
| 8,796,469 B2 | 8/2014 | Hayoz et al. |
| 2009/0065878 A1 | 3/2009 | Li |
| 2011/0082278 A1 | 4/2011 | He |
| 2011/0098478 A1 | 4/2011 | He et al. |
| 2011/0284826 A1 | 11/2011 | Hayoz et al. |
| 2012/0035375 A1 | 2/2012 | He et al. |
| 2012/0220713 A1* | 8/2012 | He .................. C08G 61/126 524/547 |
| 2013/0085256 A1* | 4/2013 | He .................. C08G 61/126 528/321 |
| 2013/0109821 A1* | 5/2013 | He .................. C07D 495/22 526/256 |
| 2014/0217329 A1 | 8/2014 | Hayoz et al. |
| 2015/0057420 A1* | 2/2015 | He .................. C07F 5/02 526/256 |
| 2015/0206616 A1* | 7/2015 | He .................. C08G 61/126 427/58 |

FOREIGN PATENT DOCUMENTS

| | | | |
|---|---|---|---|
| WO | 2008106019 | 9/2008 | |
| WO | 2009123695 | 10/2009 | |
| WO | 2010108873 | 9/2010 | |
| WO | 2010115767 | 10/2010 | |
| WO | 2011025455 | 3/2011 | |
| WO | 2012175530 | 12/2012 | |
| WO | 2013083506 | 6/2013 | |
| WO | 2013150005 | 10/2013 | |
| WO | WO 2014035716 A1 * | 3/2014 | ............ C08G 61/126 |
| WO | WO 2015026882 A1 * | 2/2015 | ............... C07F 5/02 |
| WO | WO 2015081095 A1 * | 6/2015 | ............ C08G 61/126 |

OTHER PUBLICATIONS

Lee, W.-Y., et al., "Effect of Non-Chlorinated Mixed Solvents on Charge Transport and Morphology of Solution-Processed Polymer Field-Effect Transistors," Adv. Funct. Mater. 2014, 24, 3524-3534.*
Park, G. E., "Acene-Containing Donor-Acceptor Conjugated Polymers: Correlation between the Structure of Donor Moiety, Charge Carrier Mobility, and Charge Transport Dynamics in Electronic Devices," Macromolecules 2014, 47, 3747-3754.*
Shi, Q., et al., "High performance tetrathienoacene-DDP based polymer thin-film transistors using a photo-patternable epoxy gate insulating layer," Organic Electronics 2014, 15, 991-996.*
Wu, H.-C., et al., "A Rapid and Facile Soft Contact Lamination Method: Evaluation of Polymer Semiconductors for Stretchable Transistors," Chem. Mater. 2014, 26, 4544-4551.*
Xie, Y., et al., "High performance organic thin film transistors using chemically modified bottom contacts and dielectric surfaces," Organic Electronics, 2014, 15, 2073-2078.*
Zeng, Z., et al., "Synthesis and photovoltaic performance of low band gap copolymers based on diketopyrrolopyrrole and tetrathienoacene with different conjugated bridges," J. Mater. Chem. A 2014, 2, 653-662.*
Han, A.-R., et al., "ε-Branched Flexible Side Chain Substituted Diketopyrrolopyrrole-Containing Polymers Designed for High Hole and Electron Mobilities," Adv. Funct. Mater. 2015, 25, 247-254 (published online: Nov. 20, 2014).*
Kline, R. J., et al., "Controlling the Field-Effect Mobility of Regioregular Polythiophene by Changing the Molecular Weight," Adv. Mater. 2003, 15, 1519-1522.*
Boyi Fu et al: "Enhancing Field-Effect Mobility of Conjugated Polymers Through Rational Design of Branched Side Chains", Advanced Functional Materials, Wiley—V C H Verlag GMBH & Co. KGAA, DE, vol. 24, No. 24, Jun. 25, 2014, (Jun. 25, 2014), pp. 3734-3744.
Jang Yeol Back et al: "Investigation of Structure-Property Relationships in Diketopyrrolopyrrole-Based Polymer Semiconductors via Side-Chain Engineering", Chemistry of Materials, vol. 27, No. 5, Jan. 28, 2015, (Jan. 28, 2015), pp. 1732-1739.
Fong et al; J. Am. Chem. Soc. 2008, 130, 13202.
Li et al; "A Stable Solution-Processed Polymer Semiconductor With Record High-Mobility for Printed Transistors". Scientific Reports. 2012. pp. 1-9.
Hong et al; Review Paper: Recent Developments in Light Extraction Technologies of Organic Light Emitting Diodes: Electronic Materials Letters. vol. 7., No. 2 (2011, pp. 77-91.
Allard et al; Chem. Int. Ed. 2008, 47, 4070.
Bao et al; Organic Field-Effect Transistors, 1st ed., CRC Press: Boca Raton, FL, 2007.
Bronstein et al; J. Am. Chem. Soc. 2011, 133, 3272.
Fu et al; "Enhancing Field-Effect Mobility of Conjugated Polymers Through Rational Design of Branched Side Chains". Advanced Functional Materials vol. 24, Issue 24, pp. 3734-3744, Jun. 25, 2014.
He et al; J. Am. Chem. Soc. 2009, 131, 11930.
Holliday et al; "Advances in Charge Carrier Mobilities of Semiconducting Polymers Used in Organic Transistors". Chem. Mater. 2014, 26(1), 647-663.
Kang et al; "Record High Hole Mobility in Polymer Semiconductors via Side-Chain Engineering" J. Am. Chem. Soc. 2013, 135, 14896.
Kang et al; "Record High Hole Mobility in Polymer Semiconductors via Side☐Chain Engineering". American Chemical Society (2013), 135(40), 14896-14989.
Katz; "Recent Advances in Semiconductor Performance and Printing Processes for Organic Transistor-Based Electronics"; Chem. Mater. 2004, 16, 4748.
Lei et al; "Influence of Alkyl Chain Branching Positions on the Hole Mobilities of Polymer Thin-Film Transistors" Adv. Mater. 2012, 24, 6457.
Li et al; "A High Mobility P-Type DPP-Thieno[3,2-b]thiophene Copolymer for Organic Thin-Film Transistors"; Adv. Mater. 2010, 22, 4862-4866.
Matthews et al; "Scalable Synthesis of Fused Thiophene-Diketopyrrolopyrrole Semiconducting Polymers Processed from Nonchlorinated Solvents into High Performance Thin Film Transistors". Chem. Mater. 2013, 25(5), 782-789.
Meager et al; "Photocurrent Enhancement from Diketopyrrolopyrrole Polymer Solar Cells through Alkyl-Chain Branching Point Manipulation" Journal of the American Chemical Society (2013), 135(31), 11537-11540.
Sirringhaus et al; "Two-dimensional charge transport in self-organized, high mobility conjugated polymers"; Nature 1999, 401, 685.
Street "Unraveling charge transport in conjugated polymers". Science (Washington, DC, United States) (2013), 341 (6150), 1072-1073.

(56) References Cited

OTHER PUBLICATIONS

Sun et al "Record High Electron Mobility of 6.3 cm2V-1s-1 Achieved for Polymer Semiconductors Using a New Building Block". Advanced Materials (Weinheim, Germany) (2014), 26(17), 2636-2642.

Yun et al; "Conformation-Insensitive Ambipolar Charge Transport in a Diketopyrrolopyrrole-Based Co-polymer Containing Acetylene Linkages". Chem. Mater. 2014, Ahead of Print.

* cited by examiner

DPP WITH BRANCHED ALKYL-CHAIN OR (AND) FUSED THIOPHENE WITH BRANCHED ALKYL-CHAIN AND THE RELATED DESIGNING STRATEGY TO INCREASE THE MOLECULAR WEIGHT OF THEIR SEMI-CONDUCTING COPOLYMERS

CROSS-REFERENCE TO RELATED APPLICATIONS

This application claims the benefit of priority under 35 U.S.C. §120 of U.S. Application Ser. Nos. 62/242,681, filed Oct. 16, 2015 and 62/109,176, filed Jan. 29, 2015, the content of both of which is relied on and incorporated by reference in its entirety.

BACKGROUND

Field

Described herein are compositions including heterocyclic organic compounds. More specifically, described herein are fused thiophene compounds, methods for making them, and uses thereof.

Technical Background

Highly conjugated organic materials are currently the focus of great research activity, chiefly due to their interesting electronic and optoelectronic properties. They are being investigated for use in a variety of applications, including field effect transistors (FETs), thin-film transistors (TFTs), organic light-emitting diodes (OLEDs), electro-optic (EO) applications, as conductive materials, as two photon mixing materials, as organic semiconductors, and as non-linear optical (NLO) materials. Highly conjugated organic materials may find utility in devices such as RFID tags, electroluminescent devices in flat panel displays, and in photovoltaic and sensor devices.

Materials such as pentacene, poly(thiophene), poly(thiophene-co-vinylene), poly(p-phenylene-co-vinylene) and oligo(3-hexylthiophene) have been intensively studied for use in various electronic and optoelectronic applications. In particular, fused thiophene compounds have been found to have advantageous properties. For example, bisdithieno[3,2-b:2',3'-d]thiophene (1, j=2) has been found to efficiently π-stack in the solid state, possesses high mobility (up to 0.05 $cm^2/V \cdot s$), and has a high on/off ratio (up to $10^8$). Oligomers and polymers of fused thiophenes, such as oligo- or poly(thieno[3,2-b]thiophene (2) and oligo- or poly(dithieno[3,2-b:2'-3'-d]thiophene) (1):

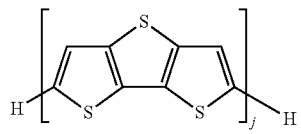

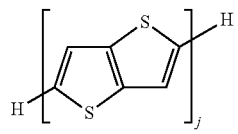

have also been suggested for use in electronic and optoelectronic devices, and have been shown to have acceptable conductivities and non-linear optical properties. However, unsubstituted fused thiophene-based materials tend to suffer from low solubility, marginal processability and oxidative instability. Thus, there remains a need for fused thiophene-based materials having acceptable solubility, processability and oxidative stability.

SUMMARY

Described herein are polymer compositions including heterocyclic organic compounds, such as fused thiophene compounds, methods for making them, and uses thereof. The compositions and methods described herein possess a number of advantages over prior art compositions and methods. For example, the substituted fused thiophene compositions described herein may be made to be more soluble and processable than the analogous unsubstituted thiophene compositions. Polymers and oligomers including the fused thiophene moieties described herein may be processable using conventional spin-coating operations. Further, the compositions described herein may be made with substantially no β-H content, greatly improving the oxidative stability of the compositions.

A first aspect comprises a polymer comprising the repeat unit of formula 1' or 2':

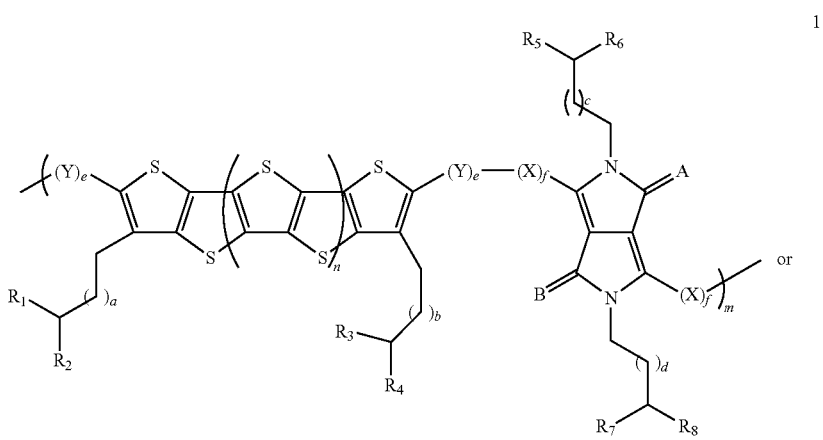

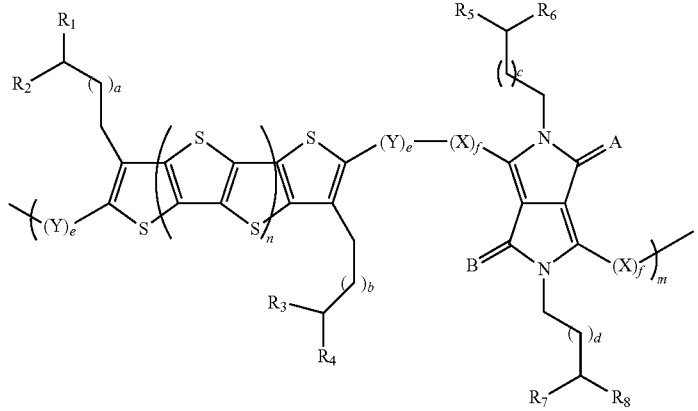

wherein, in the structure 1' and 2', n and m may be integers, greater than or equal to one; $R_1$, $R_2$, $R_3$, $R_4$, $R_5$, $R_6$, $R_7$, and $R_8$ may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl; a, b, c, and d, independently, may be integers greater than or equal to 3; e and f may be integers greater than or equal to zero; X and Y are, independently a covalent bond, an optionally substituted aryl group, an optionally substituted heteroaryl, an optionally substituted fused aryl or fused heteroaryl group, an alkyne or an alkene; and A and B may be, independently, either S or O, with the provisos that:

i. at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl;

ii. if any of $R_1$, $R_2$, $R_3$, or $R_4$ is hydrogen, then none of $R_5$, $R_6$, $R_7$, or $R_8$ are hydrogen; and iii. if any of $R_5$, $R_6$, $R_7$, or $R_8$ is hydrogen, then none of $R_1$, $R_2$, $R_3$, or $R_4$ are hydrogen.

iv. e and f cannot both be 0;

v. if either e or f is 0, then c and d, independently, are integers greater than or equal to 5; and vi. the polymer having a molecular weight, wherein the molecular weight of the polymer is greater than 10,000.

In some embodiments, m is from 1 to 1000. In some embodiments, A and B are O. In some embodiments, f is 1 and e is 1. In other embodiments, f is 1 and e is 0. In some embodiments, either $R_1$, $R_2$, $R_3$, and $R_4$, or $R_5$, $R_6$, $R_7$, and $R_8$, are an optionally substituted alkyl group comprising from 8 to 40 carbon atoms. In some embodiments, all of $R_1$, $R_2$, $R_3$, $R_4$, $R_5$, $R_6$, $R_7$, and $R_8$, are an optionally substituted alkyl group comprising from 8 to 40 carbon atoms. In some embodiments, each of $R_1$, $R_2$, $R_3$, $R_4$, $R_5$, and $R_7$ is an optionally substituted alkyl group comprising from 8 to 40 carbon atoms and $R_6$ and $R_8$ each are hydrogen. In other embodiments, each of $R_5$, $R_6$, $R_7$, $R_8$, $R_1$, and $R_3$ is an optionally substituted alkyl group comprising from 8 to 40 carbon atoms and $R_2$ and $R_4$ each are hydrogen.

In some embodiments, a and b are integers equal to 3, 4, 5, or 6. In some embodiments, a=b, where a and b are integers equal to 3, 4, or 5. In some embodiments, c and d are integers equal to 3, 4, 5, 6, or 7. In some embodiments, where f=1 and e=0, c=d, where c and d are integers equal to 5 or more.

The present disclosure also relates, in various embodiments, to a compound, comprising the formula 3' or 4'

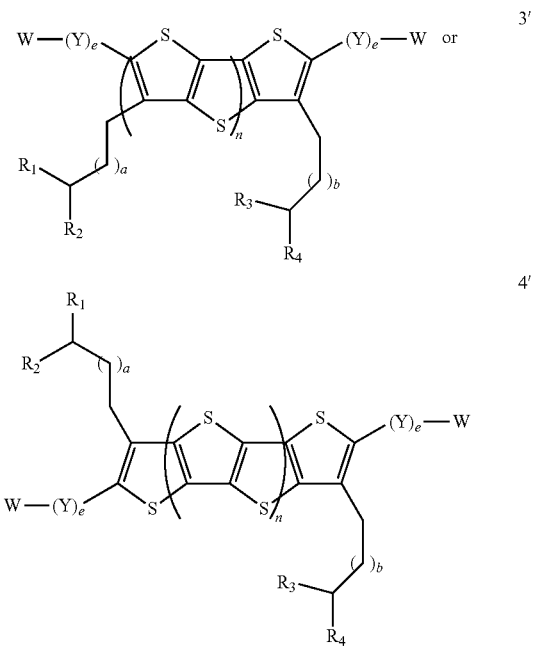

wherein $R_1$, $R_2$, $R_3$, $R_4$, a, b, Y, e, and n are as defined above for 1' and 2', and each W may be, independently, hydrogen, substituted or unsubstituted alkyl, substituted or unsubstituted alkenyl, substituted or unsubstituted alkynyl, aryl, cycloalkyl, aralkyl, amino, ester, aldehyde, hydroxyl, alkoxy, thiol, thioalkyl, halide, acyl halide, acrylate, or vinyl ether, or a substituted or unsubstituted tri-alkyl tin or a boronic ester group or alternative group useful for Suzuki or Stille coupling.

The present disclosure also relates, in various embodiments, to a method of making a polymer comprising a substituted fused thiophene. The method of making the polymer may be carried out by reacting a diketopyrrolopyrrole (DPP)-based monomer comprising a moiety of structure 6' with a fused thiophene compound 3' or 4', optionally in the presence of a metal catalyst,

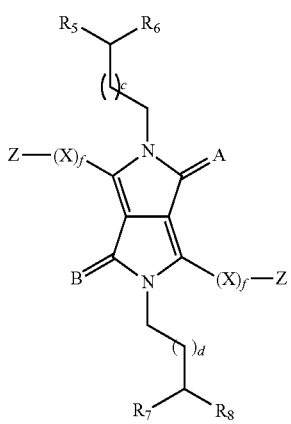

wherein, in 6', X, f, c, d, A, B, $R_5$, $R_6$, $R_7$, and $R_8$ are as defined above for 1' and 2', and Z may be a halogen.

In some embodiments, the reacting fused thiophene 3' or 4' comprises a ditin or diboron-based reactive structure. In some embodiments, fused thiophene ditin or diboron may comprise a moiety of structure 7' or 8':

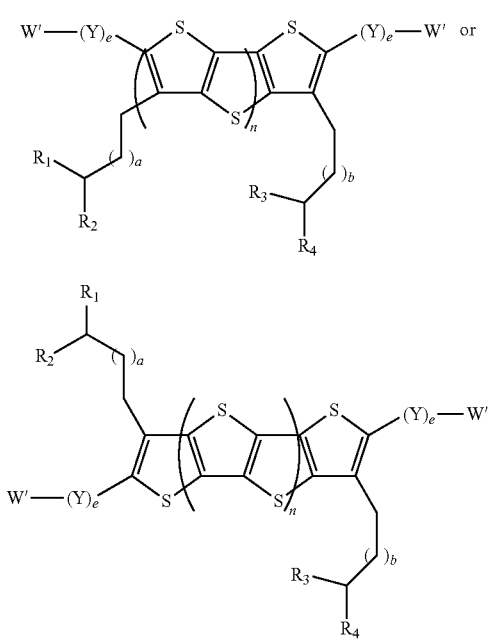

wherein, each $R_1$, $R_2$, $R_3$, $R_4$, a, b, Y, e, and n are as defined above for 1' and 2', and W' may be a substituted or unsubstituted tri-alkyl tin or boronic ester group or alternative group useful for Suzuki or Stille coupling.

Additional features and advantages will be set forth in the detailed description which follows, and in part will be readily apparent to those skilled in the art from the description or recognized by practicing the embodiments as described in the written description and claims hereof, as well as in the appended drawings.

It is to be understood that both the foregoing general description and the following detailed description are merely exemplary, and are intended to provide an overview or framework for understanding the nature and character of the invention.

BRIEF DESCRIPTION OF THE DRAWINGS

The accompanying drawings are included to provide a further understanding of the description, and are incorporated in and constitute a part of this specification. The drawings are not necessarily to scale, and sizes of various elements may be distorted for clarity. The drawings illustrate one or more embodiment(s) and together with the description serve to explain the principles and operation of the embodiments.

DETAILED DESCRIPTION

Figure 1:
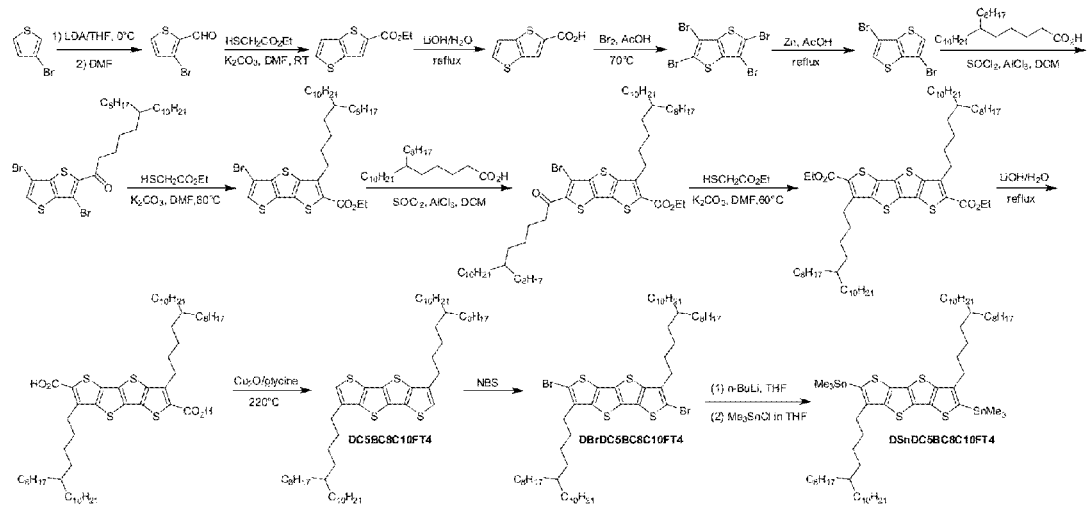
FIG. 1 shows a reaction scheme for forming fused thiophene with branched alkyls.

Before the present materials, articles, and/or methods are disclosed and described, it is to be understood that the aspects described below are not limited to specific compounds, synthetic methods, or uses as such may, of course, vary. It is also to be understood that the terminology used herein is for the purpose of describing particular aspects only and is not intended to be limiting.

In this specification and in the claims that follow, reference will be made to a number of terms that shall be defined to have the following meanings:

Throughout this specification, unless the context requires otherwise, the word "comprise," or variations such as "comprises" or "comprising," will be understood to imply the inclusion of a stated integer or step or group of integers or steps but not the exclusion of any other integer or step or group of integers or steps.

It must be noted that, as used in the specification and the appended claims, the singular forms "a," "an" and "the" include plural referents unless the context clearly dictates otherwise. Thus, for example, reference to "a carrier" includes mixtures of two or more such carriers, and the like.

"Optional" or "optionally" means that the subsequently described event or circumstance may or cannot occur, and that the description includes instances where the event or circumstance occurs and instances where it does not.

Ranges may be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

The term "alkyl group" as used herein may be a branched or unbranched saturated hydrocarbon group of 1 to 40 carbon atoms (or with a number of carbon atoms as defined by the nomenclature $C_\gamma$-$C_\zeta$, where $\gamma$ and $\zeta$ are a numerical values with $\gamma<\zeta$), such as methyl, ethyl, n-propyl, isopropyl, n-butyl, isobutyl, t-butyl, pentyl, hexyl, heptyl, octyl, decyl, or tetradecyl, and the like. The alkyl group may be substituted or unsubstituted. The term "unsubstituted alkyl group" is defined herein as an alkyl group composed of just carbon and hydrogen. The term "substituted alkyl group" is defined herein as an alkyl group with one or more hydrogen atoms substituted with a group including, but not limited to, an aryl group, cycloalkyl group, aralkyl group, an alkenyl group, an alkynyl group, an amino group, an ester, an aldehyde, a hydroxyl group, an alkoxy group, a thiol group, a thioalkyl group, or a halide, an acyl halide, an acrylate, or a vinyl ether. For example, the alkyl groups may be an alkyl hydroxy group, where any of the hydrogen atoms of the alkyl group are substituted with a hydroxyl group.

The term "alkyl group" as defined herein also includes cycloalkyl groups. The term "cycloalkyl group" as used herein is a non-aromatic carbon-based ring composed of at least three carbon atoms, and in some embodiments from three to 20 carbon atoms. Examples of cycloalkyl groups include, but are not limited to, cyclopropyl, cyclobutyl, cyclopentyl, cyclohexyl, etc. The term cycloalkyl group also includes a heterocycloalkyl group, where at least one of the carbon atoms of the ring may be substituted with a heteroatom such as, but not limited to, nitrogen, oxygen, sulfur, or phosphorus.

The term "aryl group" as used herein may be any carbon-based aromatic group, fused carbon-based aromatic group, including, but not limited to, benzene, naphthalene, etc. The term "aryl group" also includes "heteroaryl group," meaning an aromatic ring composed of at least three carbon atoms that has at least one heteroatom incorporated within the ring of the aromatic group. Examples of heteroatoms include, but are not limited to, nitrogen, oxygen, sulfur, and phosphorus. The aryl group may be substituted or unsubstituted. The aryl group may be substituted with one or more groups including, but not limited to, alkyl, alkynyl, alkenyl, aryl, halide, nitro, amino, ester, ketone, aldehyde, hydroxy, carboxylic acid, or alkoxy as defined herein. In some embodiments, the term "aryl group" may be limited to substituted or unsubstituted aryl and heteroaryl rings having from three to 30 carbon atoms.

The term "aralkyl" as used herein may be an aryl group having an alkyl group as defined above attached to the aryl group. An example of an aralkyl group may be a benzyl group.

The term "alkenyl group" is defined as a branched or unbranched hydrocarbon group of 2 to 40 carbon atoms and structural formula containing at least one carbon-carbon double bond.

The term "alkynyl group" is defined as a branched or unbranched hydrocarbon group of 2 to 40 carbon atoms and a structural formula containing at least one carbon-carbon triple bond.

The term "conjugated group" is defined as a linear, branched or cyclic group, or combination thereof, in which p-orbitals of the atoms within the group are connected via delocalization of electrons and wherein the structure may be described as containing alternating single and double or triple bonds and may further contain lone pairs, radicals, or carbenium ions. Conjugated cyclic groups may comprise one of or both aromatic and non-aromatic groups, and may comprise polycyclic or heterocyclic groups, such as diketopyrrolopyrrole. Ideally, conjugated groups are bound in such a way as to continue the conjugation between the thiophene moieties they connect. In some embodiments, "conjugated groups" may be limited to conjugated groups having three to 30 carbon atoms.

Disclosed are compounds, compositions, and components that may be used for, may be used in conjunction with, may be used in preparation of, or are products of the disclosed methods and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each may be specifically contemplated and described herein. Thus, if a class of molecules A, B, and C are disclosed as well as a class of molecules D, E, and F and an example of a combination molecule, A-D may be disclosed, then even if each is not individually recited, each may be individually and collectively contemplated. Thus, in this example, each of the combinations A-E, A-F, B-D, B-E, B-F, C-D, C-E, and C-F are specifically contemplated and should be considered disclosed from disclosure of A, B, and C; D, E, and F; and the example combination A-D. Likewise, any subset or combination of these may be also specifically contemplated and disclosed. Thus, for example, the sub-group of A-E, B-F, and C-E are specifically contemplated and should be considered disclosed from disclosure of A, B, and C; D, E, and F; and the example combination A-D. This concept applies to all aspects of this disclosure including, but not limited to, steps in methods of making and using the disclosed compositions. Thus, if there are a variety of additional steps that may be performed it may be understood that each of these additional steps may be performed with any specific embodiment or combination of embodiments of the disclosed methods, and that each such combination may be specifically contemplated and should be considered disclosed.

The fused thiophene moieties described herein are substituted with optionally substituted alkyl groups at the β-positions of the fused thiophene ring system. As used herein, an α-position of a fused thiophene ring system may be a non-fused carbon center that may be directly adjacent to the sulfur of a fused thiophene, while a β-position may be a non-fused carbon center that may be separated from the sulfur of the fused thiophene by an α-position. In the structures 1'-4' and 7'-8', the α-positions are shown as being connected to the rest of the composition, while the β-positions are substituted with $R_1$, $R_2$, $R_3$, $R_4$ linked to the β-positions by alkyl chains.

One aspect comprises a polymer comprising a repeat unit of formula 1' or 2':

ii. if any of $R_1$, $R_2$, $R_3$, or $R_4$ is hydrogen, then none of $R_5$, $R_6$, $R_7$, or $R_8$ are hydrogen; and iii. if any of $R_5$, $R_6$, $R_7$, or $R_8$ is hydrogen, then none of $R_1$, $R_2$, $R_3$, or $R_4$ are hydrogen.

iv. e and f cannot both be 0;

v. if either e or f is 0, then c and d, independently, are integers greater than or equal to 5; and vi. the polymer having a molecular weight, wherein the molecular weight of the polymer is greater than 10,000.

In one aspect, at least one of $R_1$, $R_2$, $R_3$, $R_4$, $R_5$, $R_6$, $R_7$, and $R_8$ may be a substituted or unsubstituted $C_4$ or greater alkyl group. For example, at least one of $R_1$, $R_2$, $R_3$, $R_4$, $R_5$, $R_6$, $R_7$, and $R_8$ may be an unsubstituted $C_4$ or greater alkyl group. In this aspect, the unsubstituted $C_4$ or greater alkyl

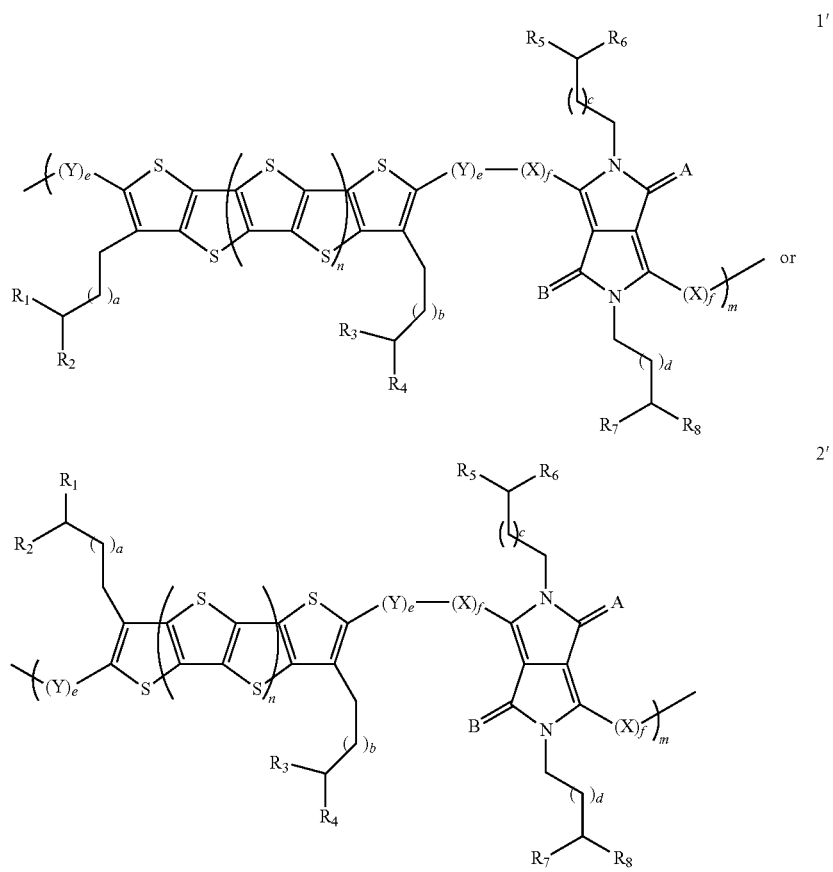

wherein, in the structure 1' and 2', n and m may be integers, greater than or equal to one; $R_1$, $R_2$, $R_3$, $R_4$, $R_5$, $R_6$, $R_7$, and $R_8$ may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl; a, b, c, and d, independently, may be integers greater than or equal to 3; e and f may be integers greater than or equal to zero; X and Y are, independently a covalent bond, an optionally substituted aryl group, an optionally substituted heteroaryl, an optionally substituted fused aryl or fused heteroaryl group, an alkyne or an alkene; and A and B may be, independently, either S or O, with the provisos that:

i. at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl;

group may be a straight-chain alkyl group (e.g. butyl, pentyl, hexyl, heptyl, octyl, nonyl, decyl, undecyl, dodecyl or hexadecyl), a branched alkyl group (e.g. sec-butyl, neopentyl, 4-methylpentyl), or a substituted or unsubstituted $C_5$ or greater cycloalkyl group (e.g. cyclopentyl, cyclohexyl). In one aspect, at least one of $R_1$, $R_2$, $R_3$, $R_4$, $R_5$, $R_6$, $R_7$, and $R_8$ comprises a substituted $C_4$ or greater alkyl. At least one of $R_1$, $R_2$, $R_3$, $R_4$, $R_5$, $R_6$, $R_7$, and $R_8$ may be substituted with amino, ester, aldehyde, hydroxyl, alkoxy, thiol, thioalkyl, halide, acyl halide, acrylate, or vinyl ether moieties or any combination of two or more of these. The selection of $R_1$, $R_2$, $R_3$, $R_4$, $R_5$, $R_6$, $R_7$, and $R_8$ will depend on the end use of the fused thiophene moiety-containing composition. The methods described herein permit the synthesis of fused thiophene moieties having a wide variety of $R_1$, $R_2$, $R_3$, $R_4$, $R_5$, $R_6$, $R_7$, and $R_8$ substituents. Any functionality on a substituted alkyl group may be protected in order to survive subsequent reaction steps In some embodiments, each $R_1$, $R_2$, $R_3$, $R_4$, $R_5$, $R_6$, $R_7$, and $R_8$ is, independently, a substituted or unsubstituted $C_4$ or greater alkyl. In some embodiments, each $R_1$, $R_2$, $R_3$, $R_4$, $R_5$, $R_6$, $R_7$, and $R_8$ is, independently, a substituted or unsubstituted $C_6$ or greater alkyl. In some embodiments, $R_1$ and $R_3$ are hydrogen, $R_4$ and $R_2$ are each a substituted or unsubstituted $C_6$ or greater alkyl, and each $R_5$, $R_6$, $R_7$, and $R_8$ is, independently, a substituted or unsubstituted $C_8$ or greater alkyl. In some embodiments, $R_5$ and $R_7$ are hydrogen, $R_6$ and $R_8$ are each a substituted or unsubstituted $C_6$ or greater alkyl, and each $R_1$, $R_2$, $R_3$, and $R_4$ is, independently, a substituted or unsubstituted $C_8$ or greater alkyl.

In some embodiments, n is an integer of 1 or greater. In some embodiments, n is an integer from 1 to 4, or 1 to 3. In one aspect, m may be from 1 to 10,000, 1 to 9,000, 1 to 8,000, 1 to 7,000, 1 to 6,000, 1 to 5,000, 1 to 4,000, 1 to 3,000, 1 to 2,000, 1 to 1,000, 1 to 500, 1 to 250, 1 to 100, 1 to 50, 1 to 25, 1 to 10, 25 to 1000, 25 to 500, 25 to 250, 50 to 1000, 50 to 500, or 50 to 250. In some embodiments, at least one of A or B is O. In other embodiments, at least one of A or B is S.

In some embodiments, a, b, c, and d are each independently an integer of 3 or more. In some embodiments, a and b are each integers of 3 or more and c and d are integers of 4 or more. In some embodiments, a and b are each integers of 4 or more and c and d are integers of 5 or more. In some embodiments, f=1 and e=0 and c and d are integers of 5 or more. In some embodiments, a and b are each integers of from 3 to 7, and c and d are integers from 3 to 7.

In one aspect, each X and Y, is individually a conjugated group. In some embodiments, the conjugated group is a substituted or unsubstituted aryl, heteroaryl, or a double or triple bond. In some embodiments, each X and Y, is individually substituted or unsubstituted aryl or heteroaryl. In some embodiments, each X and Y, is individually substituted or unsubstituted heteroaryl. In some embodiments, each X and Y, is individually substituted or unsubstituted thiophene or fused thiophene. In some embodiments, each X and Y, is individually an unsubstituted thiophene. In some embodiments, each X and Y, is individually one of:

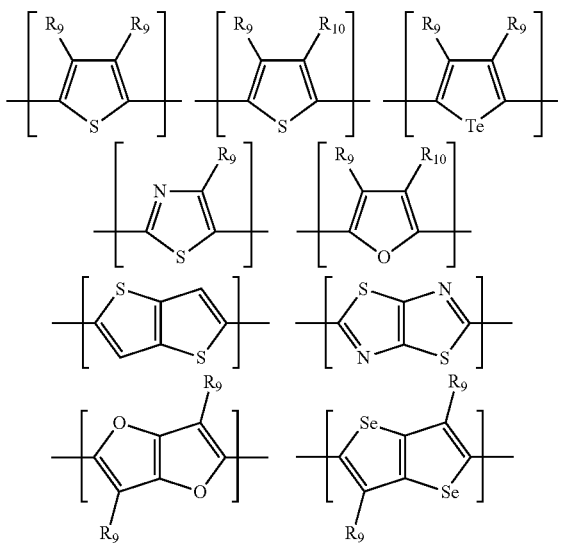

-continued

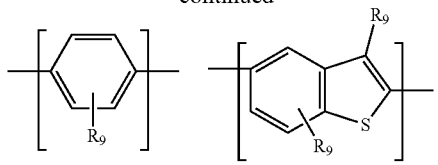

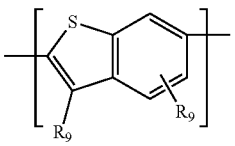 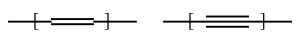

wherein each $R_9$ and $R_{10}$ is independently, hydrogen, substituted or unsubstituted alkyl having from 1 to 30 carbon atoms, substituted or unsubstituted alkenyl having from 1 to 30 carbon atoms, substituted or unsubstituted alkynyl, having from 1 to 30 carbon atoms, substituted or unsubstituted aryl having from 4 to 30 carbon atoms, substituted or unsubstituted cycloalkyl, substituted or unsubstituted aralkyl. In one embodiment, at least one of $R_9$, and $R_{10}$, independently, may be an alkyl group comprising from 2 to 30 carbon atoms. In one aspect, at least one of $R_9$, and $R_{10}$, comprises a substituted or unsubstituted alkyl. When at least one of $R_9$ and $R_{10}$ comprises a substituted alkyl, one or more substituents may be selected from amino, ester, aldehyde, hydroxyl, alkoxy, thiol, thioalkyl, halide, acyl halide, acrylate, or vinyl ether moieties or any combination of two or more of these.

The fused thiophene moieties described in 1' and 2' may have any number of fused rings above 3. For example, the fused thiophene moieties may be tetracyclic (2', n=1); pentacyclic (1', n=1), hexacyclic (2', n=2); or heptacyclic (1', n=2). The methods described herein permit the construction of fused thiophene moieties having any desired number of rings. In one aspect, for 1' and 2', n may be 1, 2, 3, 4, 5, 6, 7, 8, 9, 10, 11, 12, 13, 14, or 15.

An unexpected advantage of the embodied compounds as shown in structures 1' and 2', is that the presence of at least four long alkyl chains on the polymer, with at least two alkyl chains with branching points at the $C_4$ position or greater provide improved mobility and processability properties. In one aspect, one or both of the fused thiophene unit and the DPP unit contain branched alkyl chains where the branch point is at least four carbons away from the polymer backbone. In such embodiments, the multiple branched side chains in one polymer repeat unit significantly increase the solubility of the polymer, allowing for the polymer to be synthesized with an increased molecular weight without sacrificing other device properties, such as solution processability and π-π stacking. Additionally, the embodied polymers shown in 1' and 2' have higher field effect hole mobility than current high performance polymers, such as shown in the below structure (from U.S. application Ser. No. 13/665,055, filed Oct. 31, 2012, herein incorporated by reference):

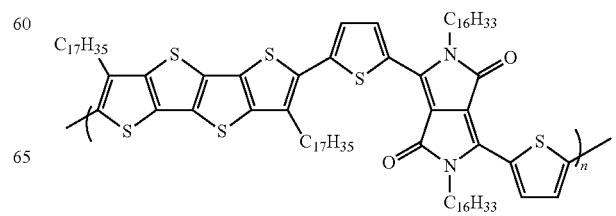

Previous work has been done to increase the solubility of OTFT polymers with the goal of improving the resulting polymer properties. However, polymers containing branched DPP units where the branched alkyl chains are only two carbons away from the nitrogen atom on the DPP showed decreased molecular weight and mobility over previous polymers. Similarly, modification of the thiophene unit to attach an alkyl chain resulted in polymer backbones that lack the planarity of earlier, high performance polymers. These results showed that for fused thiophene based systems, there was an unmet need to find a structural solution that provided highly soluble polymers with increased molecular weight without sacrificing the π stacking or π-conjugation of the polymer backbones.

It has unexpectedly been found that the best way to achieve improved mobilities and processibility properties exceeding current high performance polymers is via modification of both FT4 units and DPP units in the polymers, wherein both groups contain two large alkyl chains, with at least two alkyl chains with branching points at the $C_4$ position or greater. These embodiments result in the availability of at least two branched side chains in one polymer repeat unit. While it was expected that the large, branched alkyl chains would inhibit stacking or structured organization of the polymer, these potential issues were not observed. Rather, it is hypothesized that the embodied polymers provide superior properties because 1) since all branched alkyl chains are at least four carbons away from the main polymer backbone, there is no or very low steric effect from them to cause the twisting of the original planarity of the polymer backbone, which would interfere with the π-stacking of the polymer backbones, and 2) the existence of four large, nonpolar branched side chains in one polymer repeat unit significantly increases the solubility of these polymers and thus allow for an increase in the molecular weight of the polymers, which may result in an enhanced mobility over current high performance polymers.

One advantage of the increased solubility of the specific polymers disclosed herein is that they can be synthesized by advanced flow reactor techniques, which often can produce higher molecular weight polymers with tighter weight distribution. Additionally, in some non-limiting embodiments, the fused thiophenes (FT4) may be in liquid form at temperatures as low as 10° C., 5° C., 0° C., −5° C., or −10° C. Previously made polymers generally have limited solubility in various solvents and may be difficult to process, e.g., when preparing printed electronics, without negatively impacting electronic performance. The embodied FT4 monomers may satisfy these requirements since branched side-chain FT4 may be used to construct a larger conjugation system with less worry about solubility limitations.

In certain aspects of 1' and 2', $R_1R_2CH(CH_2)_{a+1}$ and $R_3R_4CH(CH_2)_{b+1}$ may be identical alkyl groups and/or $R_5R_6CH(CH_2)_{c+1}$ and $R_7R_8CH(CH_2)_{d+1}$ may be identical alkyl groups. When $R_1R_2CH(CH_2)_{a+1}$ and $R_3R_4CH(CH_2)_{b+1}$ and/or $R_5R_6CH(CH_2)_{c+1}$ and $R_7R_8CH(CH_2)_{d+1}$ are identical, regioregular polymers may be easily constructed because the problems of regioselectivity (i.e. head-to-tail vs. head-to-head coupling) of polymerization reactions disappear. In other aspects, $R_1R_2CH(CH_2)_{a+1}$ and $R_3R_4CH(CH_2)_{b+1}$ and/or $R_5R_6CH(CH_2)_{c+1}$ and $R_7R_8CH(CH_2)_{d+1}$ may be different. For example, one set of "R" groups (e.g., $R_1R_2$) may be at least four carbons in size, with the other set of "R" groups (e.g., $R_3R_4$) being less than four carbons in size (e.g., a methyl group). Alternatively, in another aspect, all $R_1$-$R_8$, while optionally different, may be at least four carbons in length.

As noted above with respect to moieties 1' and 2', X and Y may be attached to the α-position of the fused thiophene moiety. In some embodiments, each X and Y may independently have one of the structures:

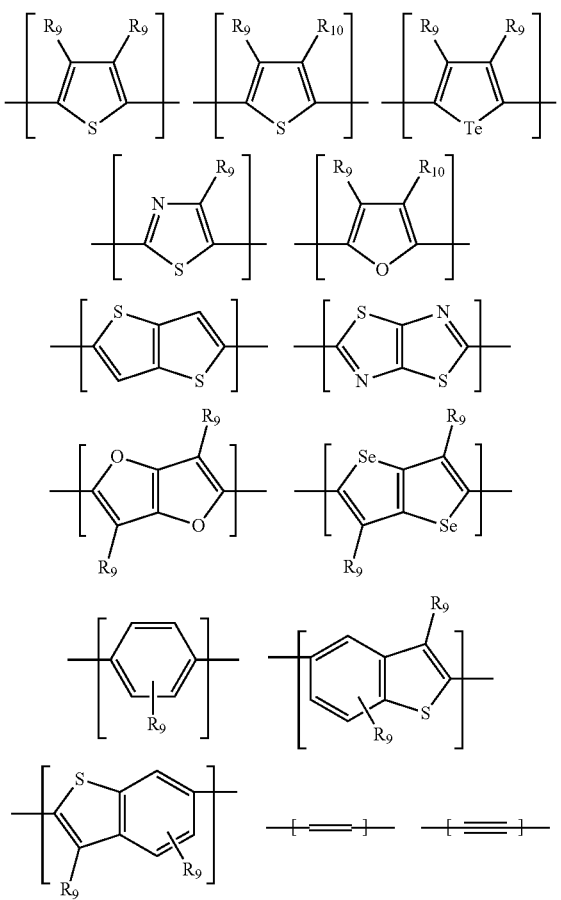

as well as mirror images of such structures. For instance,

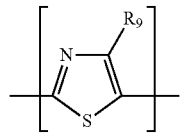

can include the following structures, without limitation:

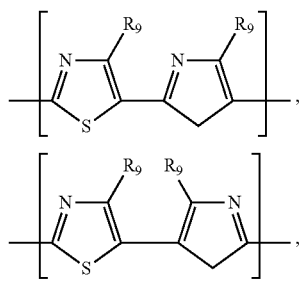

-continued

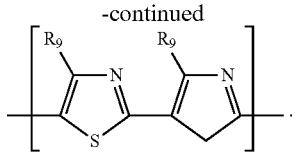

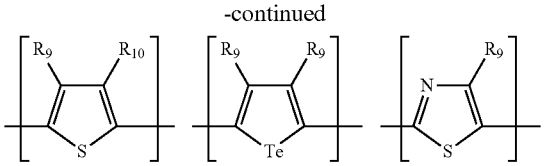

In one respect, each X or Y may independently be one of the structures:

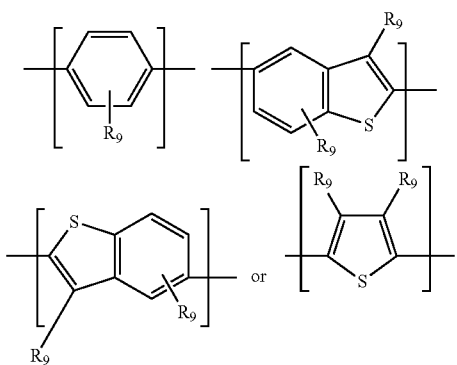

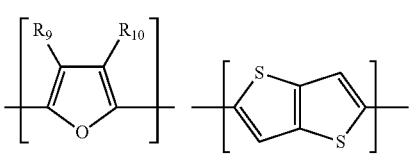

wherein g, $R_9$ and $R_{10}$ are as described above.

According to various non-limiting embodiments, the polymer may be chosen from those of formula 1' or 2', in which X=Y=substituted or unsubstituted thiophene, and e=f=1. For example, the polymer may be chosen from those of formula 1A' or 2A' below:

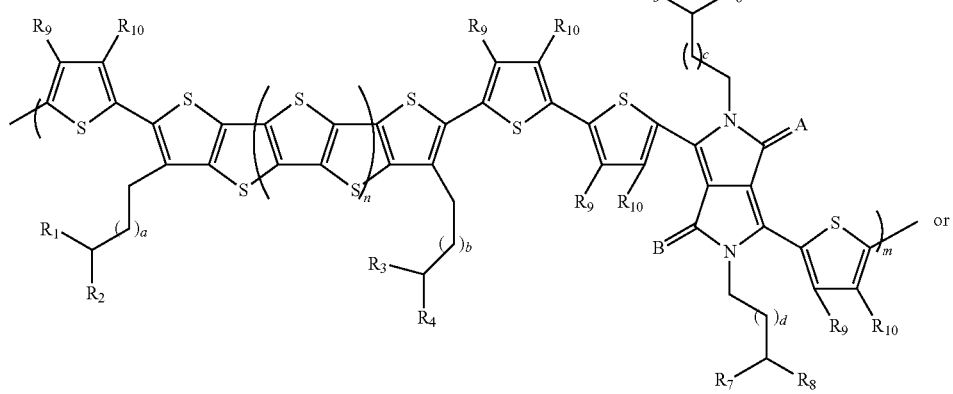

1A'

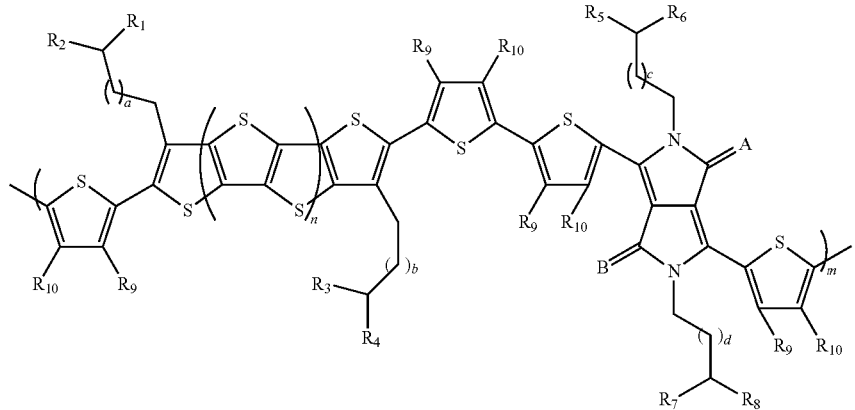

2A' wherein a, b, c, d, n, m, $R_1$, $R_2$, $R_3$, $R_4$, $R_5$, $R_6$, $R_7$, $R_8$, $R_9$, $R_{10}$, A, and B are as defined above for formulas 1' and 2'. According to further embodiments, A=B=O. In still further embodiments, $R_1=R_3$; $R_2=R_4$; $R_5=R_7$; and $R_6=R_8$. In still other embodiments, $R_1=R_3=R_2=R_4$; $R_5=R_7=R_6=R_8$. In some embodiments of 1A' and 2A' above, the thiophene groups are unsubstituted:

Alternatively, in other non-limiting embodiments, the polymer compound may be chosen from those of formula 1' or 2', in which X=substituted or unsubstituted thiophene, f=1, and $(Y)_e$=null. For example, the polymer compound may be chosen from those of formula 1AA' or 2AA' below:

wherein a, b, c, d, n, m, $R_1$, $R_2$, $R_3$, $R_4$, $R_5$, $R_6$, $R_7$, $R_8$, $R_9$, $R_{10}$, A, and B are as defined above for formulas 1' and 2'. According to further embodiments, A=B=O. In still further embodiments, $R_1=R_3$; $R_2=R_4$; $R_5=R_7$; and $R_6=R_8$. In still other embodiments, $R_1=R_3=R_2=R_4$; $R_5=R_7=R_6=R_8$. In some embodiments of 1A' and 2A' above, the thiophene groups are unsubstituted:

In certain embodiments, in formula 1', 2', 1A', 2A', 1AA', 2AA', a, b, c, or d, independently, may be integers of 3 or greater. For example, in some embodiments, a=b≥3 and/or c=d≥5. In some embodiments, a=b=3 and c=d=3, 4, 5 or 6. According to additional embodiments, at least one of X and Y may be a substituted or unsubstituted thiophene group.

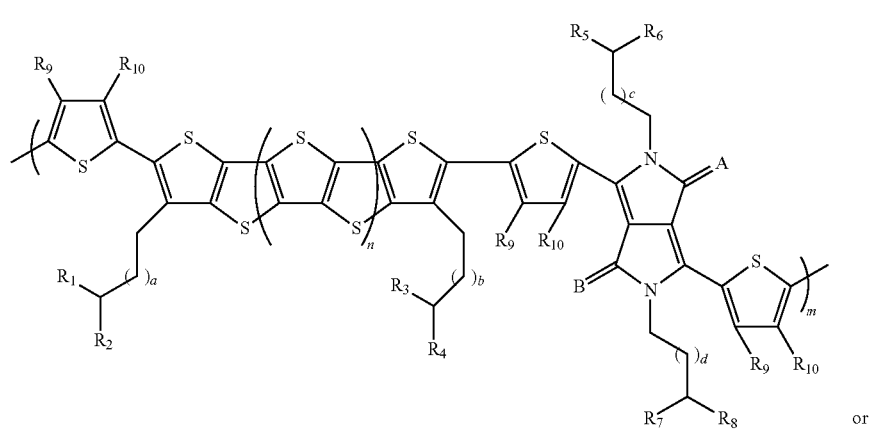

1AA' or

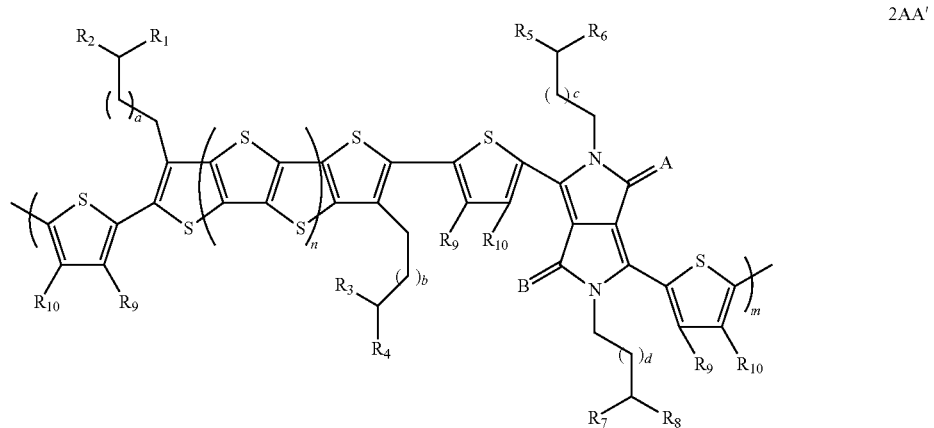

2AA'

In some embodiments, the compositions disclosed herein may comprise at least one moiety comprising the formula 1B', 2B', 1C', or 2C':
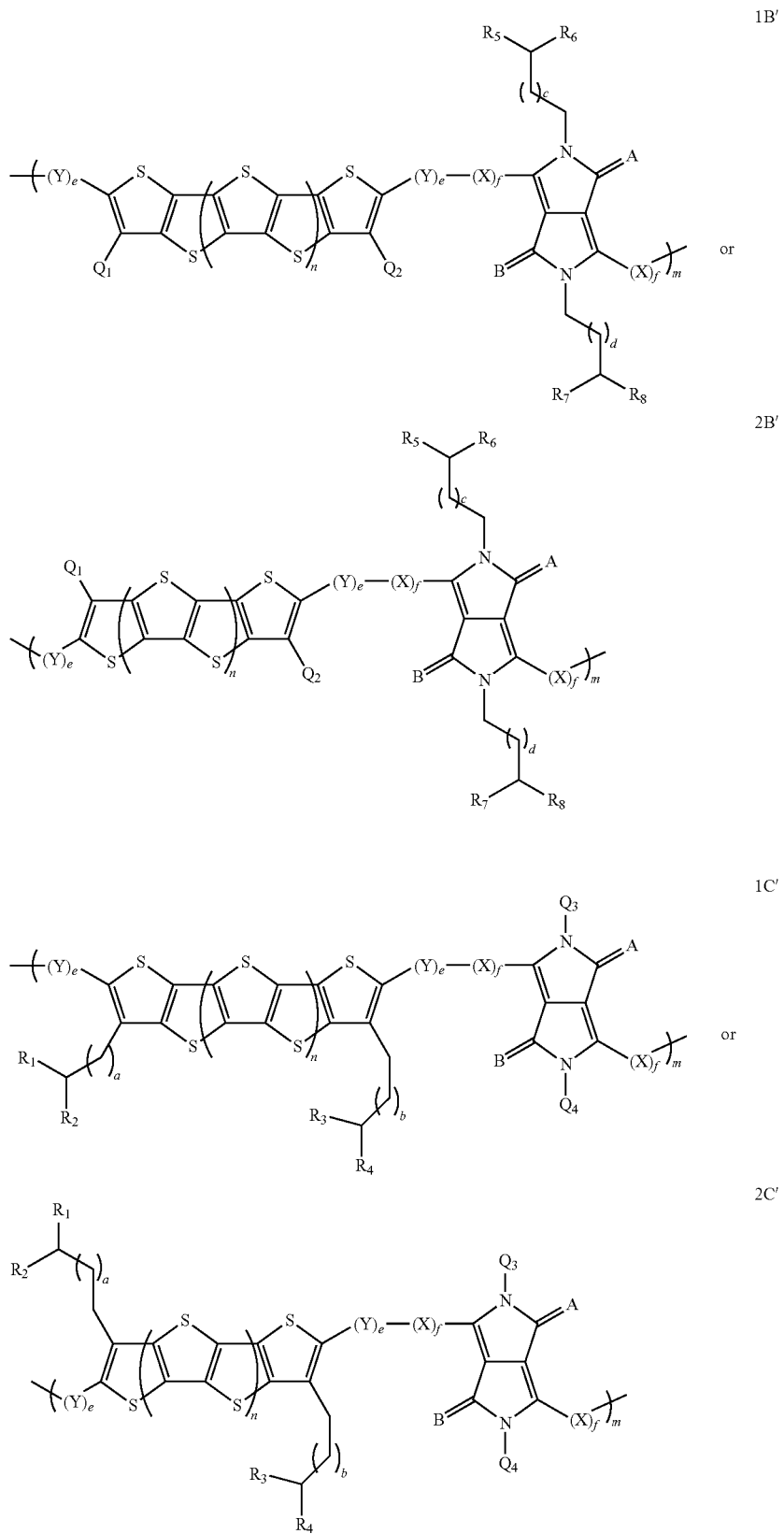

wherein, in the structures 1B', 2B', 1C', and 2C', wherein a, b, c, d, e, f, n, m, $R_1$, $R_2$, $R_3$, $R_4$, $R_5$, $R_6$, $R_7$, $R_8$, $R_9$, $R_{10}$, X, Y, A, and B are as defined above for formulas 1' and 2'; and each $Q_1$, $Q_2$, $Q_3$, and $Q_4$ may be, independently, an optionally substituted linear (i.e., unbranched) alkyl, optionally substituted linear alkenyl, or optionally substituted linear alkynyl.

In certain embodiments, in formula 1B', 2B', 1C', or 2C', a, b, c, or d, independently, may be integers greater than 3, 4, 5, or 6. According to additional embodiments, at least one of X and Y may be a substituted or unsubstituted thiophene group. In further embodiments, $Q_1$, $Q_2$, $Q_3$, and $Q_4$, independently, may be substituted or unsubstituted linear alkyl groups.

In another embodiment, a compound may comprise the formula 7' or 8'

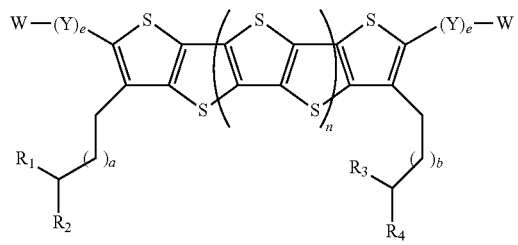

7' or

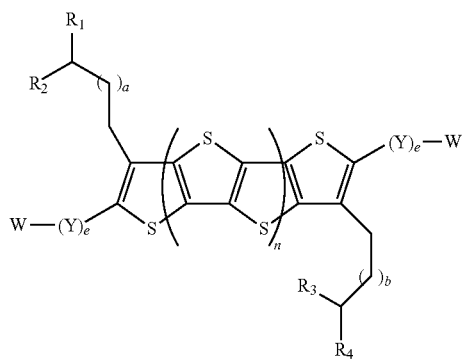

8'

In the formula 7' and 8', a, b, e, n, $R_1$, $R_2$, $R_3$, $R_4$, and Y, are as defined above for formulas 1' and 2', and W may be, independently, hydrogen, substituted or unsubstituted alkyl, substituted or unsubstituted alkenyl, substituted or unsubstituted alkynyl, aryl, cycloalkyl, aralkyl, amino, ester, aldehyde, hydroxyl, alkoxy, thiol, thioalkyl, halide, acyl halide, acrylate, or vinyl ether, or a substituted or unsubstituted tri-alkyl tin or a boronic ester group or alternative group useful for Suzuki or Stille coupling.

According to certain non-limiting embodiments, in formula 7' or 8', Y=substituted or unsubstituted thiophene, and e=1. Additionally, a and b, independently, may be integers greater than 3. For example, the compound may be chosen from those of formula 7A' or 8A' below:

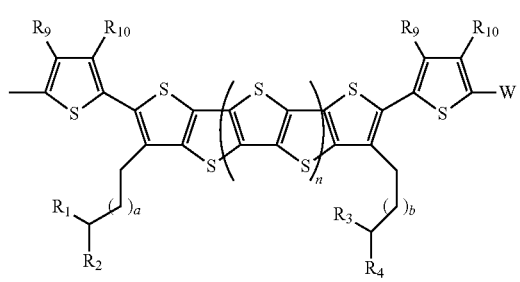

7A' or

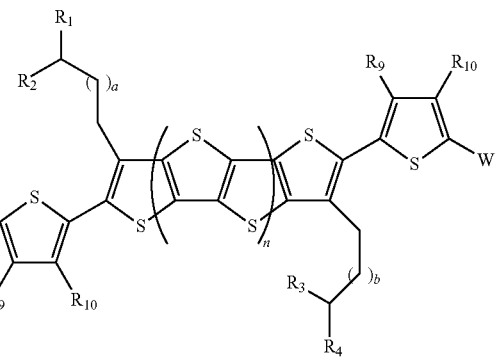

8A' wherein a, b, e, n, $R_1$, $R_2$, $R_3$, $R_4$, $R_9$, $R_{10}$, W, and Y, are as defined above for formula 7' and 8'. According to further embodiments, $R_1=R_3$ and $R_2=R_4$. According to further embodiments, A=B=O. In still further embodiments, $R_1=R_3$; $R_2=R_4$; $R_5=R_7$; and $R_6=R_8$. In still other embodiments, $R_1=R_3=R_2=R_4$; $R_5=R_7=R_6=R_8$. In some embodiments of 7A' and 8A' above, the thiophene groups are unsubstituted:

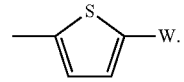

Another aspect comprises methods of making the compounds, monomers, and polymers described herein. Methods of making fused thiophene-based structures may be found in U.S. application Ser. No. 13/665,055, filed Oct. 31, 2012, U.S. application Ser. No. 12/905,667, filed Oct. 15, 2010, U.S. application. Ser. No. 12/935,426, filed Sep. 29, 2010, U.S. application. Ser. No. 12/851,998, filed Aug. 6, 2010, U.S. application. Ser. No. 13/397,021, filed Feb. 15, 2012, U.S. application Ser. No. 13/660,529, filed Oct. 25, 2012, and U.S. Pat. Nos. 7,705,108, 7,838,623, 8,389,669, 7,893,191, 8,349,998, 7,919,634, 8,278,410, and 8,217,183, all of which are incorporated herein by reference in their entirety.

In one aspect, compounds comprising the moiety 1' or 2' may be produced by reacting a compound comprising 6' with a compound comprising 7' or 8'. In one embodiment, the method for making a compound, such as 1' or 2', may be carried out by providing a diketopyrrolopyrrole (DPP) based monomer comprising a moiety of structure 6':

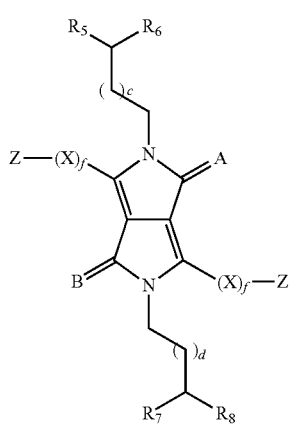

6' wherein A, B, c, d, X, f, $R_5$, $R_6$, $R_7$, and $R_8$ are as listed above for 1' and 2' and Z may be a halogen, such as Cl, Br, I, for example. In embodiments where e=0 in 7' or 8' and f=1 in 6', c and d are each independently, integers greater than or equal to 5.

The method of making the compound may be further carried out by providing a fused thiophene ditin or diboron compound comprising a moiety of structure 7" or 8":

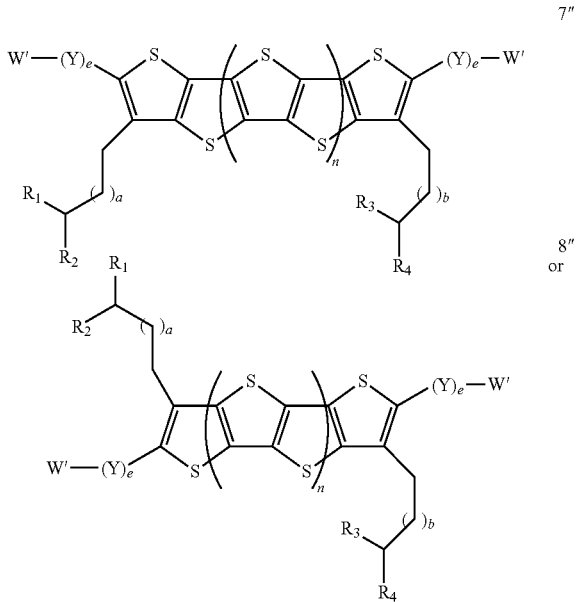

wherein a, b, e, n, $R_1$, $R_2$, $R_3$, $R_4$, and Y, are as defined above for formulas 1' and 2', and W' may be tri-alkyl tin, such as $Sn(Alk)_3$, where "Alk" is an optionally substituted alkyl group, or a boronic ester group, such as $Alk-B(OAlk)_2$, where each "Alk" is an optionally substituted alkyl group. Each W' may also be an alternative group, known or unknown, useful for Suzuki or Stille coupling.

Compounds comprising the moiety 1B' or 2B' may be produced by reacting a compound comprising 6' and 7B' or 8B'. In one aspect, the method for making a compound, such as 1B' or 2B', may be carried out by providing a diketopyrrolopyrrole (DPP) based monomer comprising a moiety of structure 6' and a fused thiophene ditin or diboron compound comprising a moiety of structure 7B' or 8B':

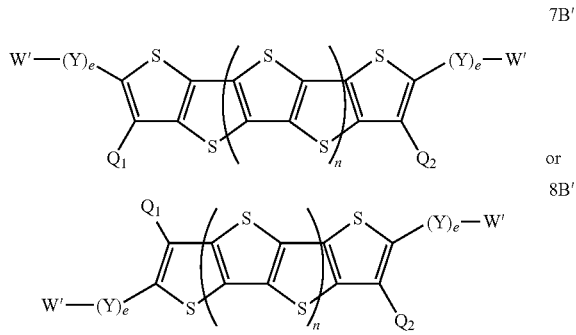

wherein e, n, Y, $Q_1$ and $Q_2$, are as defined above for formulas 1B' and 2B' and W' may be tri-alkyl tin, such as $Sn(Alk)_3$, where "Alk" is an optionally substituted alkyl group, or a boronic ester group, such as $Alk-B(OAlk)_2$, where each "Alk" is an optionally substituted alkyl group. Each W' may also be an alternative group, known or unknown, useful for Suzuki or Stille coupling.

In a further aspect, compounds comprising the moiety 1C' or 2C' may be produced by reacting a compound comprising 6C' and 7' or 8'. In one aspect, the method for making a compound, such as 1C' or 2C', may be carried out by providing a diketopyrrolopyrrole (DPP) based monomer comprising a moiety of structure 6C' below and reacting this monomer with a compound of 7' or 8' as defined above.

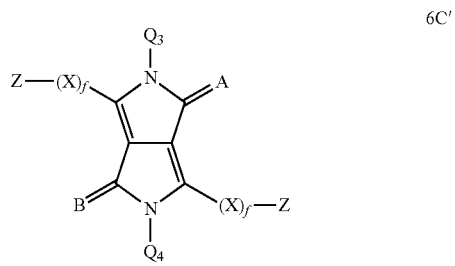

wherein Z, X, f, A, and B are as defined in 6' and $Q_3$ and $Q_4$ are as defined in 1C' and 2C'.

The methods may be further carried out by forming a polymer in presence of a metal catalyst. In one aspect, the metal catalyzed reaction may be a Stille-type reaction or Suzuki coupling reaction.

Figure 2:
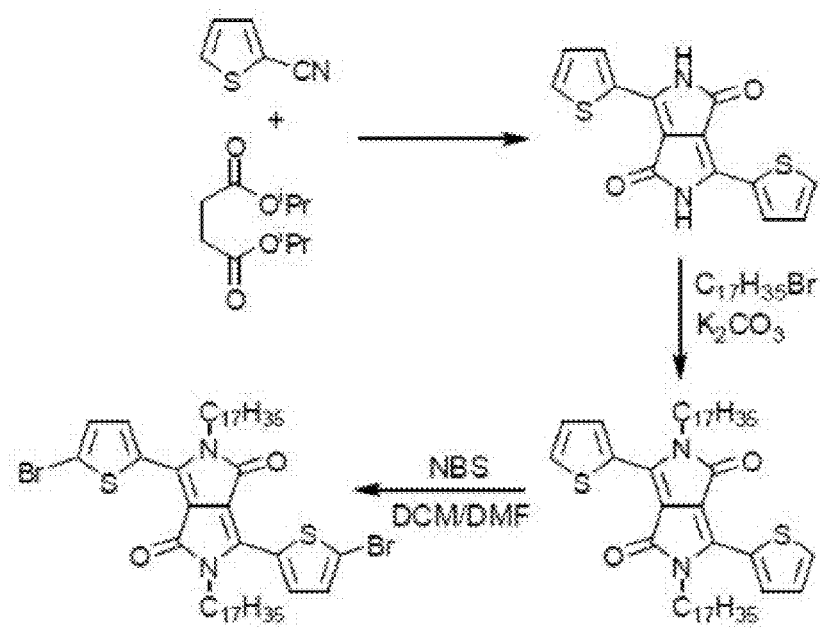
FIG. 2 describes the reaction scheme to produce 3,6-bis (5-bromothiophen-2-yl)-2,5-diheptadecylpyrrolo[3,4-c]pyrrole-1,4(2H,5H)-dione (bis-bromothienyl-DC17DPP) (diketopyrrolopyrrole="DPP").
Figure 3:
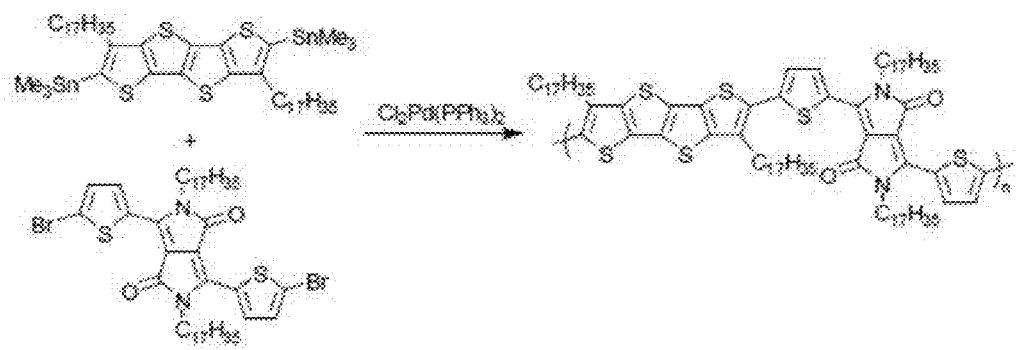
FIG. 3 describes the reaction scheme for coupling bis-tin-substituted FT4 (FT4=four-membered fused thiophene) to bis-bromothienyl-DC17DPP via a palladium-catalyzed Stille-type coupling.

In another aspect, compounds comprising the moiety 1' or 2' may be produced through a series of synthetic steps. The fused thiophene core may be synthesized and brominated as described herein. The dibromo-fused thiophene may then be sequentially reacted with butyllithium and trimethyltinchloride to form the bis-tin-substituted fused thiophene as shown in FIG. 1. The formation of the dipyrrolopyrrole moiety may be done via the reaction scheme shown in Tieke et al., Beilstein, J. ORG. CHEM. 830 (2010), herein incorporated by reference in its entirety, and may be described in FIG. 2 for example compound 3,6-bis(5-bromothiophen-2-yl)-2,5-di-heptadecylpyrrolo[3,4-c]pyrrole-1,4(2H,5H)-dione. The fused thiophene moiety and the dipyrrolopyrrole moiety may be combined to form 1' or 2' via any standard coupling reaction. In some aspects, the fused thiophene moiety and the dipyrrolopyrrole moiety may be combined via a Stille-type coupling reaction as shown in FIG. 3. The reaction in FIG. 3 uses palladium(II) catalyst as it showed good reliability, but palladium(O=0) based catalysts such as tetrakistriphenylphosphine palladium(0) could also be used. Similar synthesis schemes may be used to produce the compounds of formula 1A', 1AA', 1B', 1BB', 1C', 2A', 2B', or 2C'.

Fused thiophene and oxidized fused thiophene oligomers and polymers may be prepared using methodologies similar to those used in making oligo- and poly(thiophenes) described above. For example, α,α'-dihydro fused thiophene moieties may be oxidatively oligomerized or polymerized using iron (III) compounds (e.g., $FeCl_3$, $Fe(acac)_3$), or may be brominated and coupled in an organomagnesium mediated reaction. The fused thiophene moieties and oxidized fused thiophene moieties described herein may be incorporated into other conjugated polymers such as, for example phenylene, vinylene, and acetylene copolymers, using coupling reactions familiar to the skilled artisan. The fused thiophene moieties and oxidized fused thiophene moieties described herein may be incorporated into other main chain and side chain polymers using techniques known in the art. It is contemplated that the fused thiophene compound may be oxidized prior to incorporation into an oligomer or polymer. In the alternative, the fused thiophene compound may be incorporated into the oligomer or polymer followed by oxidation.

EXAMPLES

The following examples are put forth so as to provide those of ordinary skill in the art with a complete disclosure and description of how the materials, articles, and methods described and claimed herein are made and evaluated, and are intended to be purely exemplary and are not intended to limit the scope of the description. Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of reaction conditions, e.g., component concentrations, desired solvents, solvent mixtures, temperatures, pressures and other reaction ranges and conditions that may be used to optimize the product purity and yield obtained from the described process. Only reasonable and routine experimentation will be required to optimize such process conditions.

Synthesis of an OSC Copolymer, PTDC2BC8C10DPPTDC17FT4

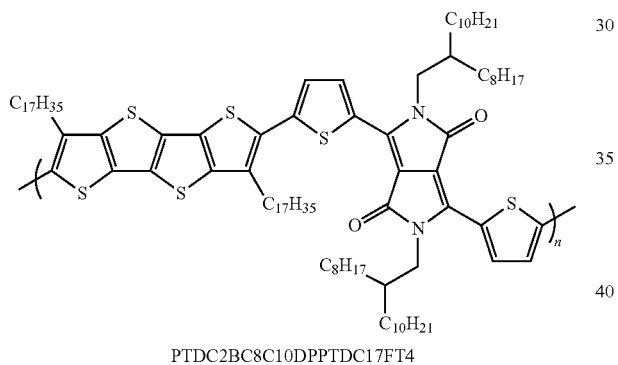

PTDC2BC8C10DPPTDC17FT4

Figure 4:
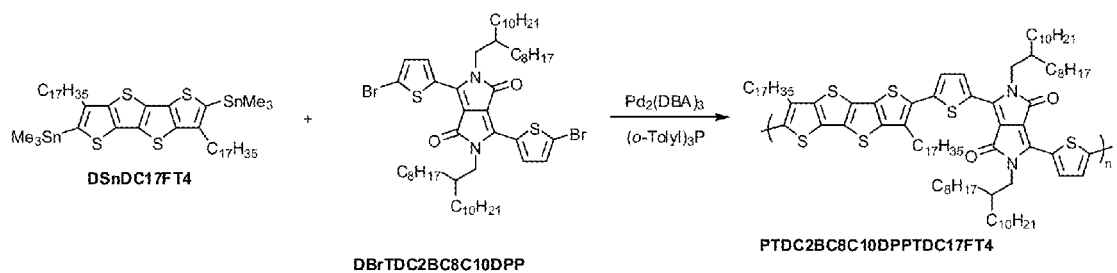
FIG. 4 describes the reaction scheme for coupling bis-tin-substituted FT4 to 3,6-bis(5-bromothiophen-2-yl)-2,5-bis(2-octyldodecyl)pyrrolo[3,4-c]pyrrole-1,4(2H, 5H)-dione (bis-bromothienyl-DC2BC8C10DPP) via a palladium-catalyzed Stille-type coupling.

As shown in FIG. 4, to a 35 mL microwave reaction vessel equipped with a magnetic stir bar are added 2,6-bis(trimethylstannyl)-3,7-bis(5-octylpentadecyl)thieno[3,2-b]thieno[2',3':4,5]thieno[2,3-d]thiophene (DSnDC17FT4) (101.9 mg, 0.100 mmol), 3,6-bis(5-bromothiophen-2-yl)-2,5-bis(2-octyldodecyl)pyrrolo[3,4-c]pyrrole-1,4(2H, 5H)-dione (bis-bromothienyl-DC2BC8C10DPP) (105.5 mg, 0.100 mmol), tris(dibenzylideneacetone)dipalladium(0) (1.8 mg, 0.002 mmol) and o-tolyl phosphine (2.4 mg, 0.0079 mmol). The reaction vessel and cap are introduced into a nitrogen glovebox, where toluene (10 mL) is added and the cap affixed to the vessel. The vessel is then removed from the glovebox and the reaction microwaved at 160° C. for 2 h. The mixture is cooled to 50° C. before release from the microwave reactor, then poured into a stirring mixture of methanol and acetylacetone (100 mL+100 mL). Hydrochloric acid (1 mL, 35% aq) is added and the mixture is stirred for 16 h. The mixture is filtered and the polymer placed into a glass with glass frit Soxhlet thimble. The polymer is extracted in a Soxhlet apparatus with acetone (250 mL) for 24 h, then hexanes (250 mL) for 24 h. The polymer is then extracted from the Soxhlet apparatus into chloroform (250 mL). The chloroform solution is poured into methanol (400 mL) with rapid stirring, followed by moderate stirring for 20 min. The polymer is then filtered from the mixture and dried under vacuum to give the product, Poly[(3,7-diheptadecylthieno[3,2-b]thieno[2',3':4,5]thieno[2,3-d]thiophene-2,6-diyl)(3,6-bis(thiophen-2-yl)-2,5-bis(2-octyldodecyl)pyrrolo[3,4-c]pyrrole-1,4(2H,5H)-dione-5,5'-diyl)] (PTDC2BC8C10DPPTDC17FT4) (0.136 g, 86%) as a purple solid. GPC (1,2,4-trichlorobenzene, 200° C.): Mn=32,000; Mw=55,600; PDI=1.73.

Synthesis of a New OSC Copolymer, PC12(o)TTDC16DPPTC12(o)TDC17FT4

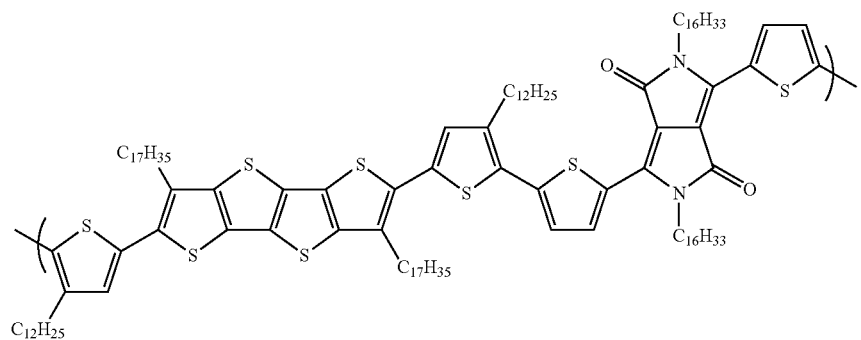

PC12(o)TTDC16DPPTC12(o)TDC17FT4

Figure 5:
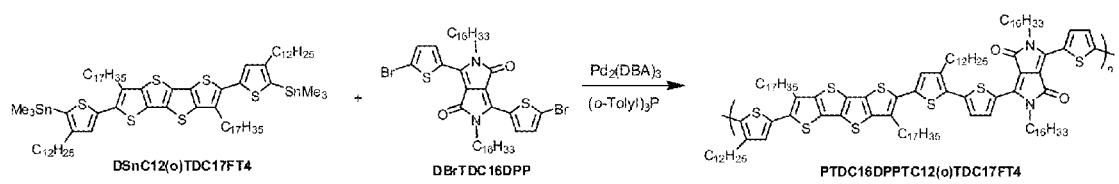
FIG. 5 illustrates a reaction scheme for coupling a bis-tin-substituted FT4 to 3,6-bis(5-bromothiophen-2-yl)-2,5-dihexadecylpyrrolo[3,4-c]pyrrole-1,4(2H, 5H)-dione (bis-bromothienyl-DC16DPP) via a palladium-catalyzed Stille-type coupling.

As shown in FIG. 5, to a 35 mL microwave reaction vessel equipped with a magnetic stir bar are added 2,6-bis(4-dodecyl-5-trimethylstannylthiophen-2-yl)-3,7-diheptadecylthieno[3,2-b]thieno[2',3':4,5]thieno[2,3-d]thiophene (DSnC12(o)TDC17FT4) (400 mg, 0.257 mmol), 3,6-bis(5-bromothiophen-2-yl)-2,5-dihexadecylpyrrolo[3,4-c]pyrrole-1,4(2H, 5H)-dione (DBrTDC16DPP) (223 mg, 0.257 mmol), tris(dibenzylideneacetone)dipalladium(0) (4.7 mg, 0.0051 mmol) and o-tolyl phosphine (6.3 mg, 0.021 mmol). The reaction vessel and cap are introduced into a nitrogen glovebox, where toluene (10 mL) is added and the cap affixed to the vessel. The vessel is then removed from the glovebox and the reaction microwaved at 160° C. for 2 h. The mixture is cooled to 50° C. before release from the microwave reactor, then poured into a stirring mixture of methanol and acetylacetone (100 mL+100 mL). Hydrochloric acid (1 mL, 35% aq) is added and the mixture stirred for 16 h. The mixture is filtered and the polymer placed into a glass with glass frit Soxhlet thimble. The polymer is extracted in a Soxhlet apparatus with acetone (250 mL) for 24 h. The polymer is soluble in hexane so no hexane extraction is carried out. The polymer is extracted into chloroform and the chloroform solution is poured into methanol (400 mL) with rapid stirring, followed by moderate stirring for 20 min. The polymer is then filtered from the mixture and dried under vacuum to give the product, Poly[(2,6-bis(4-dodecylthiophen-2-yl)-3,7-diheptadecylthieno[3,2-b]thieno[2',3':4,5]thieno[2,3-d]thiophene-5,5'-diyl)(3,6-bis(thiophen-2-yl)-2,5-dihexadecylpyrrolo[3,4-c]pyrrole-1,4(2H,5H)-dione-5,5'-diyl)] (PC12(o)TTDC16DPPTC12(o)TDC17FT4) (0.407 g, 80%) as a purple solid.

Synthesis of a New OSC Copolymer, PC12(i)TTDC16DPPTC12(i)TDC17FT4 form solution is poured into methanol (400 mL) with rapid stirring, followed by moderate stirring for 20 min. The polymer is then filtered from the mixture and dried under vacuum to give the product, Poly[(2,6-bis(3-dodecylthiophen-2-yl)-3,7-diheptadecylthieno[3,2-b]thieno[2',3':4,5]thieno[2,3-d]thiophene-5,5'-diyl)(3,6-bis(thiophen-2-yl)-2,5-dihexadecylpyrrolo[3,4-c]pyrrole-1,4(2H,5H)-dione-5,5'-diyl)] (PTDC16DPPTC12(i)TDC17FT4) (0.879 g, 69%) as a blue solid.

Synthesis of Monomer DBrTDC6BC8C10DPP

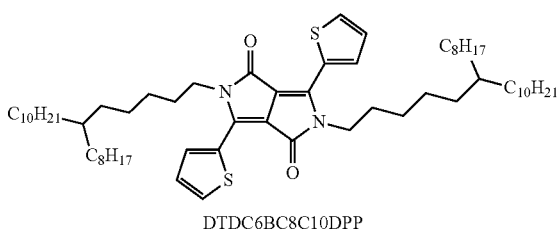

Figure 7:
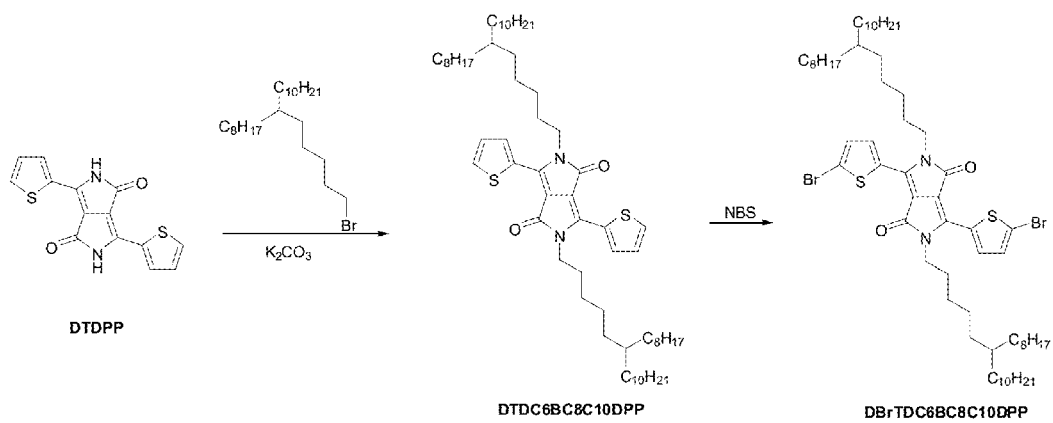
FIG. 7 describes a reaction scheme for forming a monomer 3,6-bis(5-bromothiophen-2-yl)-2,5-bis(6-octylhexadecyl)pyrrolo[3,4-c]pyrrole-1,4(2H, 5H)-dione (bis-bromothienyl-DC6BC8C10DPP).

DTDC6BC8C10DPP (1) Synthesis of DC6BC8C10DPP: As shown in FIG. 7, in a three-neck round-bottom flask, a solution of DTDPP (2.50 g, 8.3 mmol) and anhydrous K₂CO₃ (4.49 g, 32.5 mmol) in 100 mL of anhydrous N,N-dimethylformamide

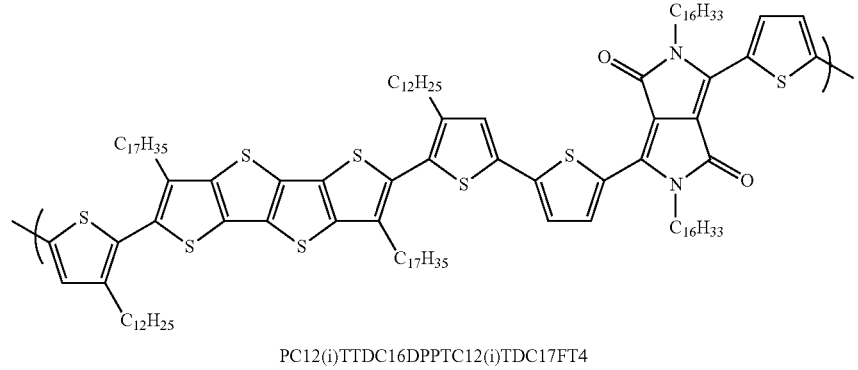

PC12(i)TTDC16DPPTC12(i)TDC17FT4

Figure 6:
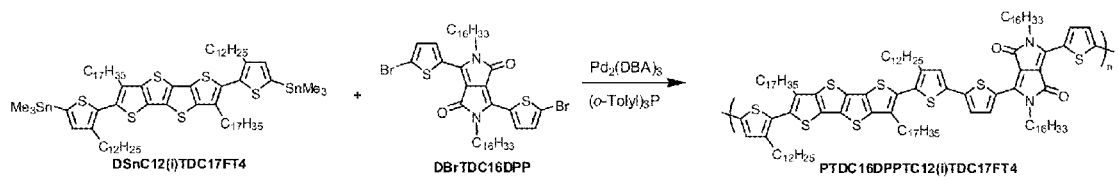
FIG. 6 illustrates a reaction scheme for coupling a bis-tin-substituted FT4 to bis-bromothienyl-DC16DPP via a palladium-catalyzed Stille-type coupling.

As shown in FIG. 6, to a 35 mL microwave reaction vessel equipped with a magnetic stir bar are added 2,6-bis(3-dodecyl-5-trimethylstannylthiophen-2-yl)-3,7-diheptadecylthieno[3,2-b]thieno[2',3':4,5]thieno[2,3-d]thiophene (DSnC12(i)TDC17FT4) (1000 mg, 0.643 mmol), DBrTDC16DPP (655 mg, 0.643 mmol), tris(dibenzylideneacetone)dipalladium(0) (11.9 mg, 0.013 mmol) and o-tolyl phosphine (15.8 mg, 0.052 mmol). The reaction vessel and cap are introduced into a nitrogen glovebox, where toluene (20 mL) is added and the cap affixed to the vessel. The vessel is then removed from the glovebox and the reaction microwaved at 160° C. for 2 h. The mixture is cooled to 50° C. before release from the microwave reactor, then poured into a stirring mixture of methanol and acetylacetone (100 mL+100 mL). Hydrochloric acid (1 mL, 35% aq) is added and the mixture stirred for 16 h. The mixture is filtered and the polymer placed into a glass with glass frit Soxhlet thimble. The polymer is extracted in a Soxhlet apparatus with acetone (250 mL) for 24 h. The polymer is very soluble in hexane so no hexane extraction is carried out. The polymer is extracted into chloroform and the chloro- (DMF) is vigorously stirred and heated to 120° C. under N₂ for 30 minutes. 6-octyl-1-hexadecyl bromide (8.69 g, 20.8 mmol) is then added dropwise. The reaction mixture is further stirred and heated at 120° C. (oil bath temperature) for 24 hours. This reaction solution is then allowed to cool down and was poured into ice water, and the resulting suspension is stirred at room temperature for 1 h. Chloroform (400 mL) is used to extract the product. Then 200 mL of hexane is used to extract the aqueous residue. The organic layers are combined and washed by water twice and then dried over anhydrous magnesium sulfate. All solvents are removed and the resulting dark reddish oily product is redissolved in hexane and shot path silica chromatography is carried out using 1:1 hexane/methylene chloride as the eluent. Solvents hexane/methylene chloride are removed to yield a dark red waxy solid that is dissolved in about 80 mL of acetone with gentle heating. The solution is then cooled and kept at −18° C. for three hours where a dark red solid forms in the bottom. Solvent acetone is removed by decanting and the residual pure dark reddish solid product, 3,6-bis(5-bromothiophen-2-yl)-2,5-bis(6-octylhexadecyl)pyrrolo[3,4-c]pyrrole-1,4(2H, 5H)-dione (DTDC6BC8C10DPP), is dried under vacuum overnight (6.18 g, 76%). 1H NMR (300 MHz, CDCl3, ppm) δ=8.94 (d, 2H), 7.66 (d, 2H), 7.28 (t, 2H), 4.07 (t, 4H), 1.76 (p, 4H), 1.49-1.21 (m, 78H), 0.88 (t, 12H).

(2) Synthesis of monomer DBrTDC6BC8C10DPP:

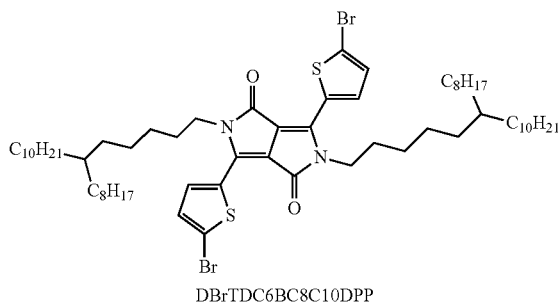

DBrTDC6BC8C10DPP

In a 250 mL three-neck round-bottom flask under $N_2$ protection, to a stirred solution of DTDC6BC8C10DPP (3.89 g, 4.0 mmol) in 80 mL of chloroform at 0° C., 1.50 g of NBS (8.4 mmol) is added in one portion. The reaction mixture is then warmed to RT slowly and stirred at RT for overnight. The reaction mixture is poured into water (100 mL) and more chloroform (300 mL) is used to extract the desired product. The chloroform extract is washed by brine (2×100 mL). The chloroform solution is dried over anhydrous magnesium sulfate. After the filtration to remove magnesium sulfate, solvent chloroform is removed under reduced pressure to yield a dark reddish solid that is dried under vacuum at 50° C. This solid is then recrystallized from acetone (200 mL). The dark reddish solid product, DBrTDC6BC8C10DPP (3,6-bis(5-bromothiophen-2-yl)-2,5-bis(6-octylhexadecyl)pyrrolo[3,4-c]pyrrole-1,4(2H, 5H)-dione), is collected by filtration and dried under vacuum overnight (4.21 g, 93%). 1H NMR (300 MHz, CDCl$_2$CDCl$_2$, ppm) δ=8.55 (d, 2H), 7.20 (d, 2H), 3.88 (t, 4H), 1.67 (p, 4H), 1.38-1.07 (m, 78H), 0.80 (t, 6H).

Synthesis of Monomer
Bis-Trimethylstannyl-DC5BC8C10FT4

(1) Synthesis of DC5BC8C10FT4

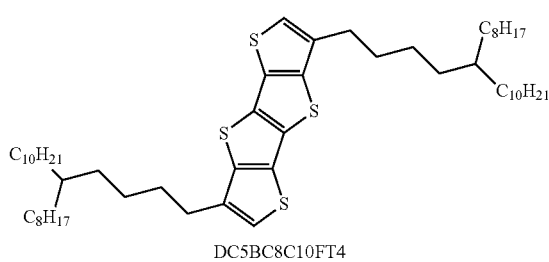

DC5BC8C10FT4

Figure 8:
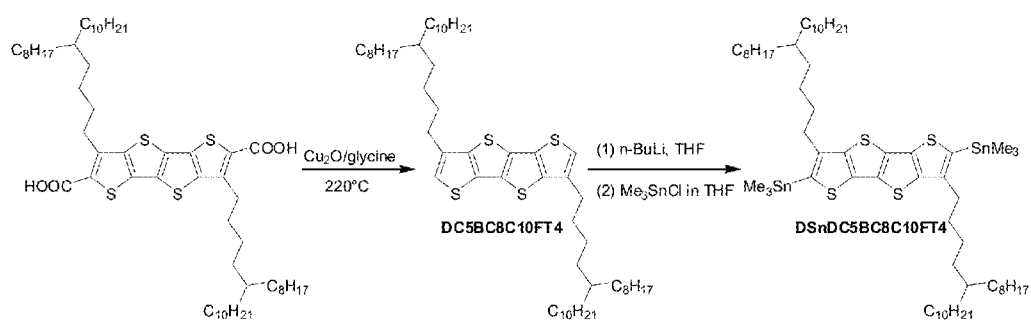
FIG. 8 illustrates a reaction scheme for forming 2,6-bis-trimethylstannyl-3,7-bis(5-octylpentadecyl)thieno[3,2-b]thieno[2',3':4,5]thieno[2,3-d]thiophene (bis-trimethylstannyl-DC5BC8C10FT4) according to one embodiment.

As shown in FIG. 8, in a 250 mL flask fitted with a condenser, dicarboxylic acid-DC5BC8C10FT4 (6.89 g, 6.99 mmol), Cu$_2$O (200 mg, 1.40 mmol), glycine (157 mg, 2.10 mmol), and 60 mL of tetraethyleneglycol dimethylether are added. Under nitrogen protection, this stirred solution is heated at 250° C. for four hours. The hot reaction mixture is filtered quickly through a hot frit to remove the copper oxide and other solid residue. After the addition of 250 mL of methanol, the filtrate is cooled in a freezer to yield a grey precipitate. The supernatant liquid is removed by decanting since the solid becomes a liquid quickly at RT. This solid is re-dissolved in 60 mL of hexane and is washed by aqueous 2M HCl$_{(aq)}$ solution (2×150 mL), then is washed by water (2×190 mL). This hexane solution is then dried over anhydrous magnesium sulfate. After a filtration, solvent hexane is removed to yield an oily product. A silica column chromatography is carried out using hexane as the eluent. Under reduced pressure, solvent hexane is removed to yield a light yellowish oily product that is dried under vacuum overnight to yield pure 3,7-bis(5-octylpentadecyl)thieno[3,2-b]thieno[2',3':4,5]thieno[2,3-d]thiophene (DC5BC8C10FT4) (5.55 g, 88%). 1H NMR (300 MHz, CD$_2$Cl$_2$, ppm) δ=7.03 (s, 2H), 2.79 (t, 4H), 1.79 (p, 4H), 1.49-1.16 (m, 74H), 0.98-0.82 (m, 12H).

(2) Synthesis of Monomer DSnDC5BC8C10FT4:

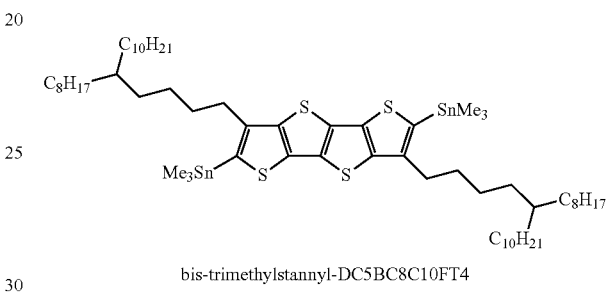

bis-trimethylstannyl-DC5BC8C10FT4

To a solution of DC5BC8C10FT4 (1.02 g, 1.14 mmol) in 25 mL of anhydrous THF in a 100 mL three neck flask at 0° C., n-BuLi (2.0 M in hexane) (1.99 mL, 3.98 mmol) is added dropwise by using a syringe. The resulting solution is stirred at RT for several hours. A Me$_3$SnCl solution (1.0 M in THF) (4.55 mL, 4.55 mmol) is then added dropwise. The reaction solution is stirred overnight. This reaction solution is quenched by adding ice-water. After removing most of THF in this solution under reduced pressure, 150 mL of water and 40 mL of hexane are added. After vigorously shaking, the hexane layer is collected. This hexane layer is then washed by water and then dried over anhydrous sodium sulfate. Solvent hexane is then removed to yield a light yellowish oily product that is dried under vacuum for three hours. This oily product is then dissolved in hot acetone and cooled to −18° C. in a freezer and acetone is then decanted. The resulting oily product 2,6-bis-trimethylstannyl-3,7-bis(5-octylpentadecyl)thieno[3,2-b]thieno[2',3': 4,5]thieno[2,3-d]thiophene (bis-trimethylstannyl-DC5BC8C10FT4) is dried under vacuum overnight (1.27 g, 91% in ~98% purity). 1H NMR (300 MHz, CD$_2$Cl$_2$, ppm) δ=2.75 (t, 4H), 1.71 (p, 4H), 1.49-1.12 (m, 74H), 0.94-0.78 (m, 12H), 0.44 (s, 18H).

Synthesis of a Designed OSC Copolymer
PTDC6BC8C10DPPTDC5B8C10FT4

Figure 9:
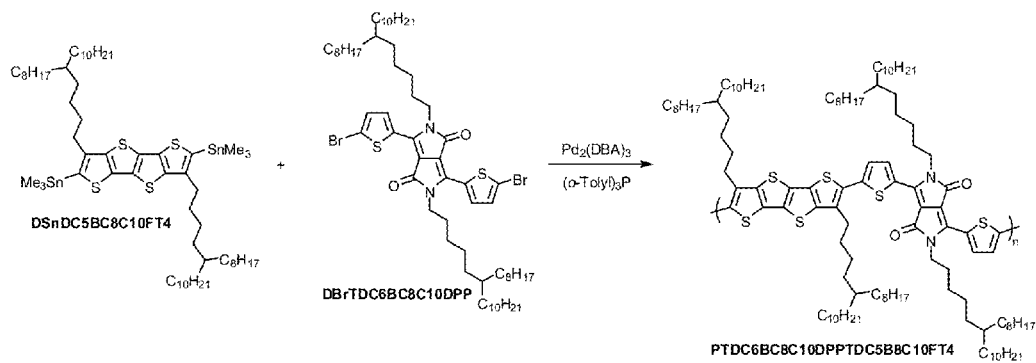
FIG. 9 illustrates a reaction scheme for coupling bis-tin-substituted FT4 to bis-bromothienyl-DC6BC8C10DPP via a palladium-catalyzed Stille-type coupling.

As shown in FIG. 9, to a three neck flask equipped with a magnetic stir bar are added bis-trimethylstannyl-DC5BC8C10FT4 (710 mg, 0.74 mmol), bis-bromothienyl-DC6BC8C10DPP (820 mg, 0.74 mmol), tris(dibenzylideneacetone)dipalladium(0) (13.6 mg, 0.0148 mmol) and o-tolyl phosphine (18.0 mg, 0.059 mmol). The flask is introduced into a nitrogen glovebox, where chlorobenzene (10 mL) is added and the septa are capped to the flask. The flask is then removed from the glovebox. Under nitrogen protection, the reaction solution is heated at 120° C. for 2 h.

The reaction solution is then cooled to RT and then poured into a stirring mixture of methanol and acetylacetone (100 mL+20 mL). Hydrochloric acid (1 mL, 35% aq) is added and the mixture stirred for 16 h. The mixture is filtered and the polymer placed into a Soxhlet thimble. The polymer is extracted in a Soxhlet apparatus with acetone (250 mL) for 24 h. The polymer is very soluble in hexane so no hexane extraction is carried out. The polymer is extracted into chloroform and the chloroform solution is poured into methanol (400 mL) with rapid stirring, followed by moderate stirring for 20 min. The polymer is then filtered from the mixture and dried under vacuum to give the product, Poly [(3,7-bis(5-octylpentadecyl)thieno[3,2-b]thieno[2',3':4,5] thieno[2,3-d]thiophene-2,6-diyl)(3,6-bis(thiophen-2-yl)-2, 5-bis(6-octylhexadecyl)pyrrolo[3,4-c]pyrrole-1,4(2H,5H)-dione-5,5'-diyl)] (PTDC6BC8C10DPPTDC5B8C10FT4) (1.17 g, 85%) as a blue-green solid.

Synthesis of Monomer
Bis-Trimethylstannyl-DC5BC8C10FT4

(1) Synthesis of DBrDC5BC8C10FT4

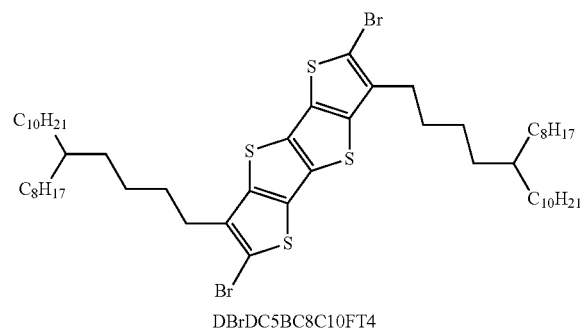

DBrDC5BC8C10FT4

Figure 10:
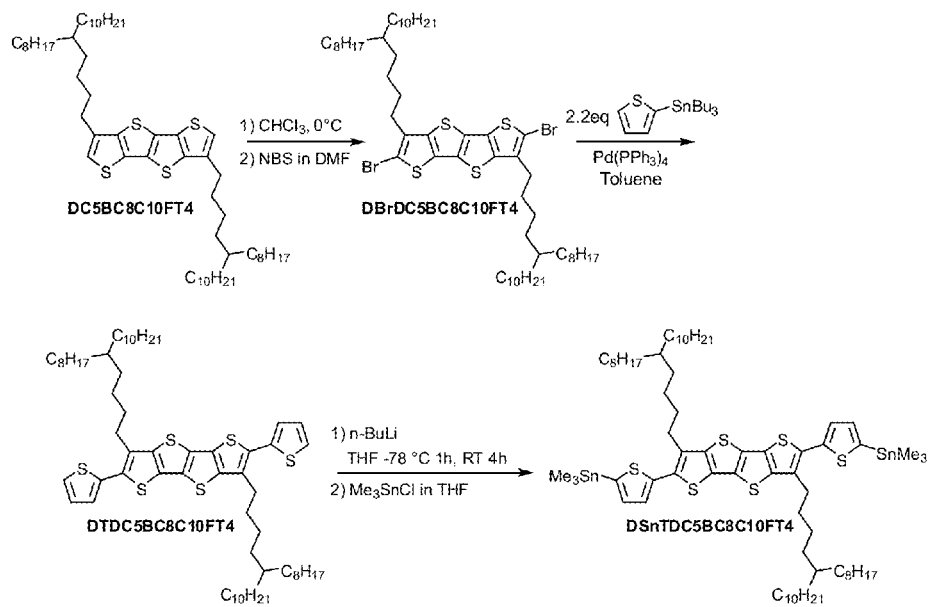
FIG. 10 illustrates a reaction scheme for forming a monomer 2,6-bis(5-trimethylstannylthiophen-2-yl)-3,7-bis (5-octylpentadecyl)thieno[3,2-b]thieno[2',3':4,5]thieno[2,3-d]thiophene (DSnTDC5BC8C10FT4).
Figure 11:
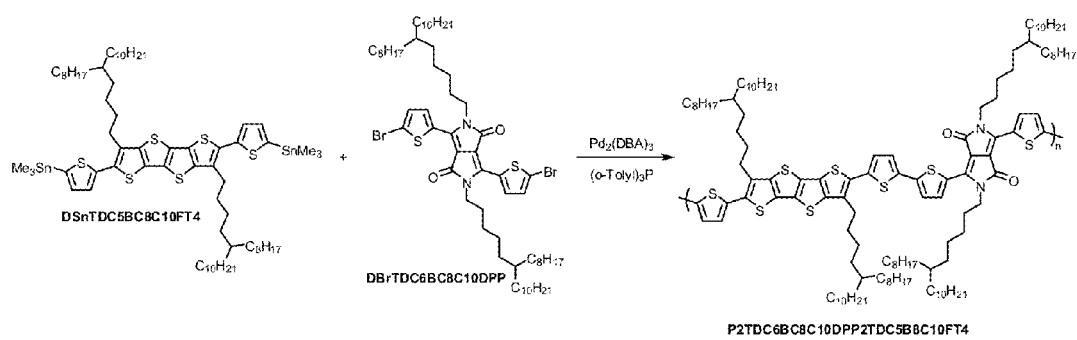
FIG. 11 illustrates a reaction scheme for coupling bis-tin-substituted FT4 to bis-bromothienyl-DC6BC8C10DPP via a palladium-catalyzed Stille-type coupling.

Referring to the reaction scheme shown in FIG. 10, in a 250 mL flask fitted with a condenser and protected with aluminum foil at 0° C., DC5BC8C10FT4 (1.00 g, 1.11 mmol) and 50 mL of CHCl$_3$ (anhydrous) are added. Under nitrogen protection, a solution of NBS (0.46 g, 2.56 mmol) in 20 mL DMF (anhydrous) is added dropwise to the flask. The resulting solution is stirred at 0° C. and warmed to room temperature overnight. The mixture is further stirred at room temperature for two days. The aluminum foil is removed, revealing that a clear solution is formed. This reaction solution is quenched by adding water and subsequently adding aqueous HCl solution into the flask, followed by 300 mL of hexane. After vigorous shaking, the organic layer is collected. The organic portion thus collected is then washed with water and dried over anhydrous sodium sulfate. The solvents are removed to yield an oily product. Silica column chromatography is carried out using hexane as the eluent. Under reduced pressure, solvent hexane is removed to yield an oily product that is dried under vacuum overnight to yield 2,6-dibromo-3,7-bis(5-octylpentadecyl)thieno[3,2-b]thieno [2',3':4,5]thieno[2,3-d]thiophene (DBrDC5BC8C10FT4) (1.16 g, 98%). 1H NMR (300 MHz, CD$_2$Cl$_2$, ppm) δ=2.76 (t, 4H), 1.71 (p, 4H), 1.43-1.12 (m, 74H), 0.92-0.81 (m, 12H).

(2) Synthesis of DTDC5BC8C10FT4:

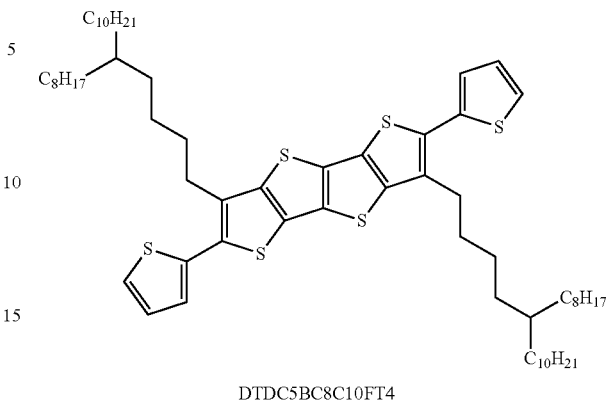

DTDC5BC8C10FT4

To DBrDC5BC8C10FT4 (1.00 g, 0.95 mmol) in a 35 mL microwave reaction test tube fitted with a stir bar, 0.813 g (2.18 mmol) of 2-(tributylstannyl)thiophene and 0.126 g (0.109 mmol) of (Pd(PPh$_3$)$_4$ are added. The tube is pump filled with nitrogen several times. The sealed tube is then placed into a nitrogen glovebox. In the glovebox, 10 mL of anhydrous toluene is added to the tube. The tube is resealed, removed from the glovebox, and placed in a microwave reactor. The tube is heated to 120° C. for a reaction time of 2 h. The resulting reaction mixture is then purified by silica column chromatography using hexane as the eluent. Under reduced pressure, solvent hexane is removed to yield a yellowish solid, which is subsequently heated in 30 mL of ethanol at 70° C. with agitation for 20 minutes. After cooling to room temperature, ethanol is removed by decanting to yield a yellowish solid product. This product is then dissolved in ethyl acetate and recrystallized after cooling to room temperature and further cooling in the refrigerator to 4° C. The resulting light yellowish solid product is collected and dried under vacuum to yield 2,6-dithienyl-3,7-bis(5-octylpentadecyl)thieno[3,2-b]thieno[2',3':4,5]thieno[2,3-d] thiophene (DTDC5BC8C10FT4) (0.84 g, 83% yield). 1H NMR (300 MHz, CD$_2$Cl$_2$, ppm) δ=7.38 (dd, 2H), 7.22 (dd, 2H), 7.11 (dd, 2H), 2.93 (t, 4H), 1.76 (p, 4H), 1.52-1.00 (m, 74H), 0.93-0.76 (m, 12H).

(3) Synthesis of bis-trimethylstannyl-DC5BC8C10FT4:

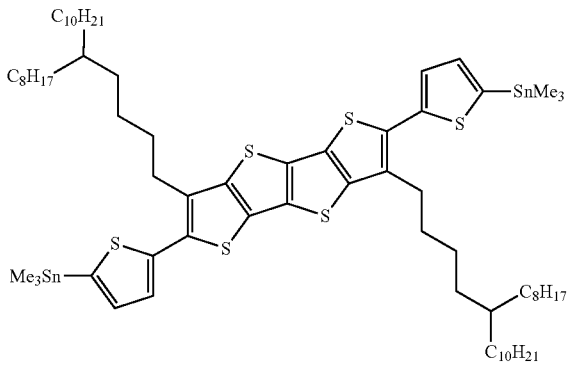

bis-trimethylstannyl-DC5BC8C10FT4

To a solution of 2,6-dithienyl-3,7-bis(5-octylpentadecyl) thieno[3,2-b]thieno[2',3':4,5]thieno[2,3-d]thiophene (DTDC5BC8C10FT4) (0.94 g, 0.89 mmol) in 22 mL of anhydrous THF in a 100 mL three neck flask at −78° C. under nitrogen protection, n-BuLi (2.0 M in hexane (1.55 mL, 3.10 mmol) is added dropwise by syringe. The resulting solution is stirred at −78° C. for four hours. The reaction temperature is warmed to −12° C. and a Me₃SnCl solution (1.0 M in THF) (3.54 mL, 3.54 mmol) is then added dropwise. The reaction solution is warmed to room temperature and stirred overnight. This reaction solution is quenched by adding ice-water. After removing most of the THF under reduced pressure, 150 mL of water and 40 mL of hexane are added. After vigorously shaking, the hexane layer is collected, washed by water and then dried over anhydrous sodium sulfate. To this oily product, 30 mL of ethanol is added, followed by washing with hot ethanol (71° C.). Solvent ethanol is then decanted while still hot and the resulting oily product is dried under vacuum to yield 2,6-bis-trimethylstannyl-3,7-bis(5-octylpentadecyl)thieno[3,2-b]thieno[2',3':4,5]thieno[2,3-d]thiophene (bis-trimethylstannyl-DC5BC8C10FT4) (1.10 g, 89% yield). 1H NMR (300 MHz, CD₂Cl₂, ppm) δ=2.97 (t, 4H), 1.81 (p, 4H), 1.58-1.03 (m, 74H), 0.97-0.82 (m, 12H), 0.45 (s, 18H).

Synthesis of a designed OSC copolymer
P2TDC6BC8C10DPP2TDC5BC8C10FT4 and the mixture stirred for 16 h. The mixture is filtered and the polymer placed into a Soxhlet thimble. The polymer is extracted in a Soxhlet apparatus with acetone (250 mL) for 24 h. The polymer is extracted into chloroform (250 mL) and the chloroform solution is poured into methanol (400 mL) with rapid stirring, followed by moderate stirring for 20 min. The polymer is then filtered from the mixture and dried under vacuum to give the product, poly[(2,6-bis(thiophen-2-yl)-3,7-bis(5-octylpentadecyl)thieno[3,2-b]thieno[2',3':4,5]thieno[2,3-d]thiophene-5,5'-diyl)alt(3,6-bis(thiophen-2-yl)-2,5-bis(6-octylhexadecyl)pyrrolo[3,4-c]pyrrole-1,4(2H,5H)-dione-5,5'-diyl)] (P2TDC6BC8C10DPP2TDC5BC8C10FT4) (1.27 g, 96.9% yield). GPC (1,2,4-trichlorobenzene, 200° C.): Mn=20,700; Mw=98,400; PDI=4.75. The molecular weight Mw of this polymer is much higher than that of poly[(3,7-diheptadecylthieno[3,2-b]thieno[2',3':4,5]thieno[2,3-d]thiophene-2,6-diyl)(3,6-bis(thiophen-2-yl)-2,5-dihexadecylpyrrolo[3,4-c]pyrrole-1,4(2H,5H)-dione-5,5'-diyl)] (PTDC16DPPTDC17FT4) (Mn=16,200; Mw=30,000; PDI=1.85). Despite their higher molecular weight, the polymers disclosed herein may still exhibit high solubility, e.g., in various organic solvents such as xylene, toluene, tetrahydronaphthalene, cyclooctane, and the like. Moreover, the polymers may be dissolved in such solvents at room temperature or at relatively low temperatures (e.g., about 100° C. or less).

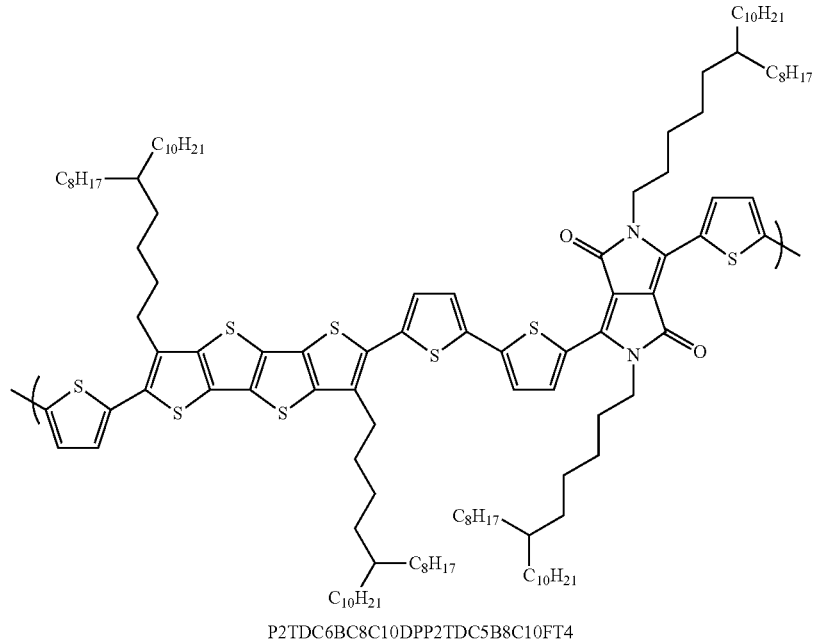

P2TDC6BC8C10DPP2TDC5B8C10FT4

Referring to the reaction scheme shown in FIG. 1, to a 100 mL three neck flask are added DSnTDC5BC8C10FT4 (900 mg, 0.65 mmol, MW 1387.2), DBrTDC6BC8C10DPP (734 mg, 0.65 mmol, MW 1131.4) (synthesized according to the reaction scheme illustrated in FIG. 7), tris(dibenzylideneacetone)dipalladium(0) (11.9 mg, 0.013 mmol) and o-tolyl phosphine (15.8 mg, 0.052 mmol). The flask is introduced into a nitrogen glovebox, where chlorobenzene (10 mL) is added and the septa are capped to the flask. The flask is then removed from the glovebox. Under nitrogen protection, the reaction solution is heated at 120° C. in an oil bath for 1 h. The reaction solution is then cooled to RT and poured into a stirring mixture of methanol and acetylacetone (200 mL+200 mL). Hydrochloric acid (2 mL, 35% aq) is added Organic Transistor Performance Organic field-effect transistors (OFETs) are fabricated by depositing solutions of P2TDC6BC8C10DPP2TDC5BC8C10FT4 (inventive) or PTDC16DPPTDC17FT4 (comparative) (5 mg/mL in p-xylene) on a highly doped silicon wafer with thermally grown oxide layer substrate in a nitrogen glovebox and annealing at 160° C. Various parameters of these fabricated devices are measured, including average charge carrier mobility ($\mu_h$), average current On/Off ratio ($I_{ON}/I_{OFF}$), and average threshold voltage ($V_{th}$). The results of these tests are presented in Table I below.

TABLE I

OFET Device Performance

| Polymer | $\mu_h^{ave}$ (cm$^2$V$^{-1}$s$^{-1}$) | $I_{ON}/I_{OFF}^{ave}$ | $V_{th}^{ave}$ (V) |
| --- | --- | --- | --- |
| P2TDC6BC8C10DPP2TDC5BC8C10FT4 (inventive) | 1.82 ± 0.44 | 2.1 × 10$^6$ | −19.7 |
| PTDC16DPPTDC17FT4 (comparative) | 0.79 ± 0.21 | 6.1 × 10$^2$ | −22.0 |

As can be appreciated from Table I, the polymers disclosed herein exhibit higher charge carrier mobility, while also exhibiting higher current on/off ratios and lower threshold voltages, generally indicating that a transistor incorporating such polymers can have a higher conductivity. Furthermore, such an increased carrier mobility can be achieved while annealing at relatively lower temperatures (e.g., as low as 160° C.), as compared to higher annealing temperatures, which are often necessary and were previously used to improve carrier mobility of known OSC polymers (e.g., 190° C. or greater).

Additionally, while the polymers disclosed herein may have relatively high molecular weight and/or molecular volume (due to longer side chains), such polymers may still exhibit the unexpected advantage of a decreased π-π stacking distance, e.g., these polymers may have improved packing ability. The lamellar spacing and in-plane stacking distance of the deposited inventive and comparative organic films are presented below in Table II.

TABLE II

Molecular Spacing

| Polymer | Lamellar Spacing (Å) | In-Plane Stacking Distance (Å) |
| --- | --- | --- |
| P2TDC6BC8C10DPP2TDC5BC8C10FT4 (inventive) | 29.6 | 3.69 |
| PTDC16DPPTDC17FT4 (comparative) | 26.0 | 3.71 |

As can be appreciated from Table II, while the overall molecular volume of the polymers disclosed herein is larger due to the presence of the four branched alkyl chains (as evidenced by a higher lamellar spacing), the branching in these chains is sufficiently far from the main polymer backbone (e.g., at least three carbons away), such that there is little or no steric effect on the polymer due to these chains. Because of the reduced steric effect imparted by the extra thiophene between the two major units (FT4 and DPP), the polymer may benefit from improved planarity and/or reduced twisting, such that the polymer can stack more efficiently (as evidenced by the reduced in-plane stacking distance). Thus, the polymers disclosed herein may benefit from the branched side chains in terms of improved solubility, while also exhibiting a good packing ability, which can result in a higher charge carrier mobility.

It will be apparent to those skilled in the art that various modifications and variations can be made to the present description without departing from the spirit and scope. Thus, it is intended that the present description cover modifications and variations of embodiments herein provided they come within the scope of the appended claims and their equivalents.

What is claimed is:

1. A polymer chosen from compounds of formula 1AA' or 2AA':

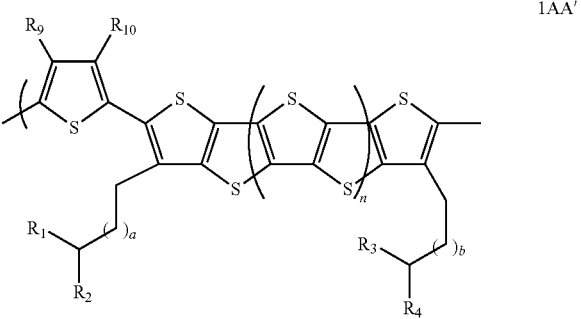

1AA'

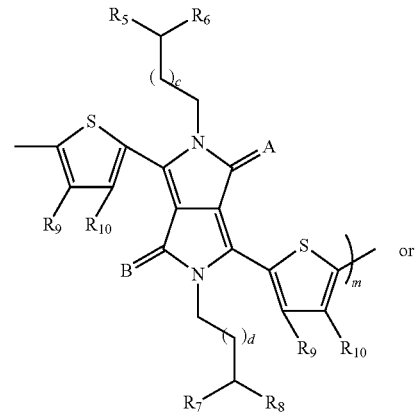

or

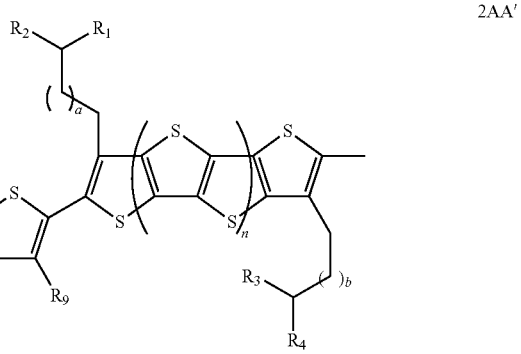

2AA'

-continued

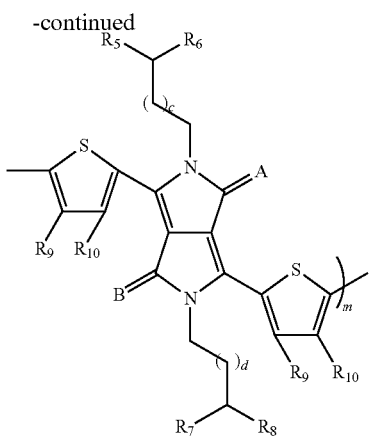

wherein m is an integer greater than or equal to one, a and b are equal and are chosen from integers greater than or equal to 3, wherein c and d are equal and are chosen from integers greater than or equal to 5, n is 1 or 2, A=B=O, $R_9=R_{10}$=H, $R_2$, $R_3$, $R_4$, $R_5$, $R_6$, $R_7$, and $R_3$ may be, independently, hydrogen, substituted or unsubstituted $C_4$ or greater alkyl, substituted or unsubstituted $C_4$ or greater alkenyl, substituted or unsubstituted $C_4$ or greater alkynyl, or $C_5$ or greater cycloalkyl; and with the provisos that:

i) at least one of $R_1$ or $R_2$; one of $R_3$ or $R_4$; one of $R_5$ or $R_6$; and one of $R_7$ or $R_8$ is a substituted or unsubstituted alkyl, substituted or unsubstituted alkenyl, substituted or unsubstituted alkynyl, or cycloalkyl;

ii) if any of $R_1$, $R_2$, $R_3$, or $R_4$ is hydrogen, then none of $R_5$, $R_6$, $R_7$, or $R_8$ are hydrogen;

iii) if any of $R_5$, $R_6$, $R_7$, or $R_8$ is hydrogen, then none of $R_1$, $R_7$, $R_3$, or $R_4$ are hydrogen; and iv) the polymer has a molecular weight, wherein the molecular weight of the polymer is greater than 10,000.

2. The polymer of claim 1, wherein a and b are 3, 4, 5, or 6, c and d are 5, 6, or 7, and each of $R_1$, $R_2$, $R_3$, $R_4$, $R_5$, and $R_7$ is an optionally substituted alkyl group comprising from 8 to 40 carbon atoms and $R_6$ and $R_3$ each are hydrogen.

3. The polymer of claim 1, wherein a and b are 3, 4, 5, or 6, c and d are 5, 6, or 7, and all of $R_1$, $R_2$, $R_3$, $R_4$, $R_5$, $R_6$, $R_7$, and $R_8$, are an optionally substituted alkyl group comprising from 8 to 40 carbon atoms.

4. The polymer of claim 1, wherein a and b are 3, 4, 5, or 6, c and d are 5, 6, or 7 and each of $R_5$, $R_6$, $R_7$, $R_8$, $R_1$, and $R_3$ is an optionally substituted alkyl group comprising from 8 to 40 carbon atoms and $R_2$ and $R_4$ each are hydrogen.

5. A polymer comprising the repeat unit:

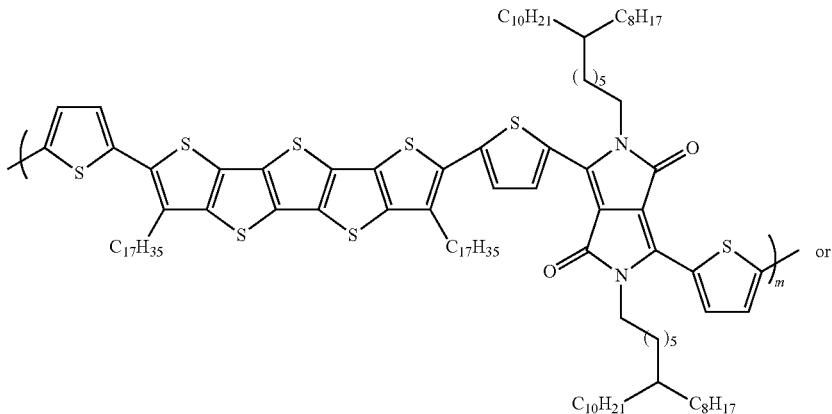 or

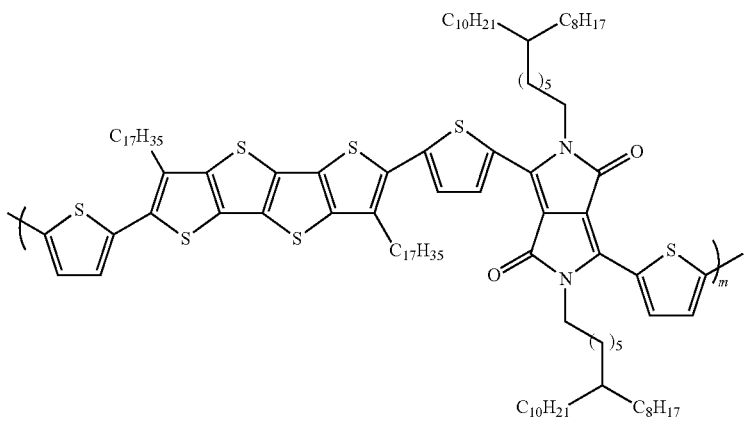

wherein m is an integer greater than or equal to 1, the polymer having a molecular weight, wherein the molecular weight of the polymer is greater than 10,000.

* * * * *